US009653065B2

(12) United States Patent
Noguchi et al.

(10) Patent No.: US 9,653,065 B2
(45) Date of Patent: May 16, 2017

(54) AUDIO PROCESSING DEVICE, METHOD, AND PROGRAM

(71) Applicant: Sony Corporation, Tokyo (JP)

(72) Inventors: Masayoshi Noguchi, Chiba (JP); Naoya Takahashi, Tokyo (JP); Masashi Fujihara, Tokyo (JP); Goro Shiraishi, Tokyo (JP); Kaneaki Fujishita, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/651,535

(22) PCT Filed: Dec. 5, 2013

(86) PCT No.: PCT/JP2013/082692
§ 371 (c)(1),
(2) Date: Jun. 11, 2015

(87) PCT Pub. No.: WO2014/097893
PCT Pub. Date: Jun. 26, 2014

(65) Prior Publication Data

US 2015/0325230 A1 Nov. 12, 2015

(30) Foreign Application Priority Data

Dec. 19, 2012 (JP) ................................ 2012-277063

(51) Int. Cl.

| | |
|---|---|
| ***H03C 3/00*** | (2006.01) |
| ***G10K 15/08*** | (2006.01) |
| ***G10K 11/175*** | (2006.01) |
| ***H04R 27/00*** | (2006.01) |
| ***G10K 15/12*** | (2006.01) |
| *H04S 5/00* | (2006.01) |
| *G10L 21/00* | (2013.01) |

(52) U.S. Cl.
CPC ............ *G10K 15/08* (2013.01); *G10K 11/175* (2013.01); *G10K 15/12* (2013.01); *H04R 27/00* (2013.01); *G10L 21/00* (2013.01); *H04S 5/00* (2013.01)

(58) Field of Classification Search
CPC ...... G10L 21/00; G10K 15/08; G10K 11/175; G10K 15/12; H04R 27/00; H04B 5/00
See application file for complete search history.

(56) References Cited

U.S. PATENT DOCUMENTS

| | | | |
|---|---|---|---|
| 6,176,780 B1 | 1/2001 | Miyamoto et al. | |
| 7,162,045 B1 | 1/2007 | Fujii | |
| 2013/0108079 A1 | 5/2013 | Sato | |
| 2013/0279701 A1* | 10/2013 | Harrington | ............ G10L 25/78 381/17 |

FOREIGN PATENT DOCUMENTS

| | | |
|---|---|---|
| JP | 10-225572 A | 8/1998 |
| JP | 2001-069597 A | 3/2001 |
| JP | 2009-193031 A | 8/2009 |
| JP | 4602204 B2 | 12/2010 |
| JP | 2012-019454 A | 1/2012 |

* cited by examiner

*Primary Examiner* — Andrew L Sniezek
(74) *Attorney, Agent, or Firm* — Wolf, Greenfield & Sacks, P.C.

(57) ABSTRACT

Provided is an audio processing device including a narration canceling section configured to generate a narration canceling signal by removing a narration component from an input signal, and a reverberation adding section configured to add a reverberation effect to the narration canceling signal.

7 Claims, 15 Drawing Sheets

AUDIO PROCESSING DEVICE, METHOD, AND PROGRAM

TECHNICAL FIELD

The present technique relates to an audio processing device, a method, and a program, and, in particular, relates to an audio processing device, a method, and a program that enable audio with a greater sense of presence to be obtained.

BACKGROUND ART

Hitherto, a technique is known that generates an audio with a greater sense of presence by performing audio processing on an audio signal of contents of a broadcast of sports, such as soccer and baseball. For example, regarding the above technique, a technique that enables the sense of presence of the audio to be adjusted by allowing the user to set a sense of distance and a broadening sensation of the audio has been proposed (see Patent Literature 1, for example).

CITATION LIST

Patent Literature

Patent Literature 1: JP 4602204B

SUMMARY OF INVENTION

Technical Problem

However, in the technique described above, while processing that improves the sense of presence is performed on the audio signal, when voices of an announcer and a commentator are large during a sports broadcast, the voices becomes harsh on the ears the more and a sense of presence is not capable of being obtained in a sufficient manner.

The present technique has been made in view of the above situation and enables an audio having a greater sense of presence to be obtained.

Solution to Problem

According to an aspect of the present technology, there is provided an audio processing device including a narration canceling section configured to generate a narration canceling signal by removing a narration component from an input signal, and a reverberation adding section configured to add a reverberation effect to the narration canceling signal.

The narration canceling section can generate the narration canceling signal that includes a pseudo-cheer component.

The narration canceling section can generate a center suppression signal having a plurality of channels by suppressing a center orientation component included in the input signal having a plurality of channels, generate, on a basis of the input signal having a plurality of channels, a monaural center orientation removal signal in which the center orientation component has been removed, and configure the narration canceling signal by adding the center suppression signal and the center orientation removal signal together.

The narration canceling section can further generate a pseudo-cheer signal that is a pseudo-cheer component and configure the narration canceling signal by adding the center suppression signal, the center orientation removal signal, and the pseudo-cheer signal together.

The narration canceling section can perform level adjustment of the pseudo-cheer signal on a basis of a comparison result between a level of the input signal and a level of the center orientation removal signal.

The input signal may be an audio signal of a sports related content.

The narration canceling section may detect a score scene on a basis of the input signal and performs level adjustment of the pseudo-cheer signal on a basis of a detection result of the score scene.

The narration canceling section may detect a non-cheer scene on a basis of the input signal and performs level adjustment of the pseudo-cheer signal on a basis of a detection result of the non-cheer scene.

According to another aspect of the present technology, there is provided a program for causing a computer to execute the processing of generating a narration canceling signal by removing a narration component from an input signal, and adding a reverberation effect to the narration canceling signal.

According to another aspect of the present technology, a narration canceling signal is generated by removing a narration component from an input signal, and a reverberation effect is added to the narration canceling signal.

Advantageous Effects of Invention

According to an aspect of the present technique, an audio with a greater sense of presence can be obtained.

DESCRIPTION OF EMBODIMENTS

Hereinafter, an embodiment to which the present technique has been applied will be described with reference to the drawings.

<First Embodiment>

<Exemplary Configuration of Stadium Effect Generation Device>

The present technique removes audio of an announcer and a commentator, in other words, narrative audio, from an audio signal of contents such as a sports broadcast and, further, adds reverberation to the audio signal, the narration of which has been removed, so as to acquire audio with a greater sense of presence.

Note that the contents that are to be the processing object may be any contents that include a narration; however, hereinafter, the description will be continued while having a soccer broadcast program as an example of the contents of the processing object.

Figure 1:
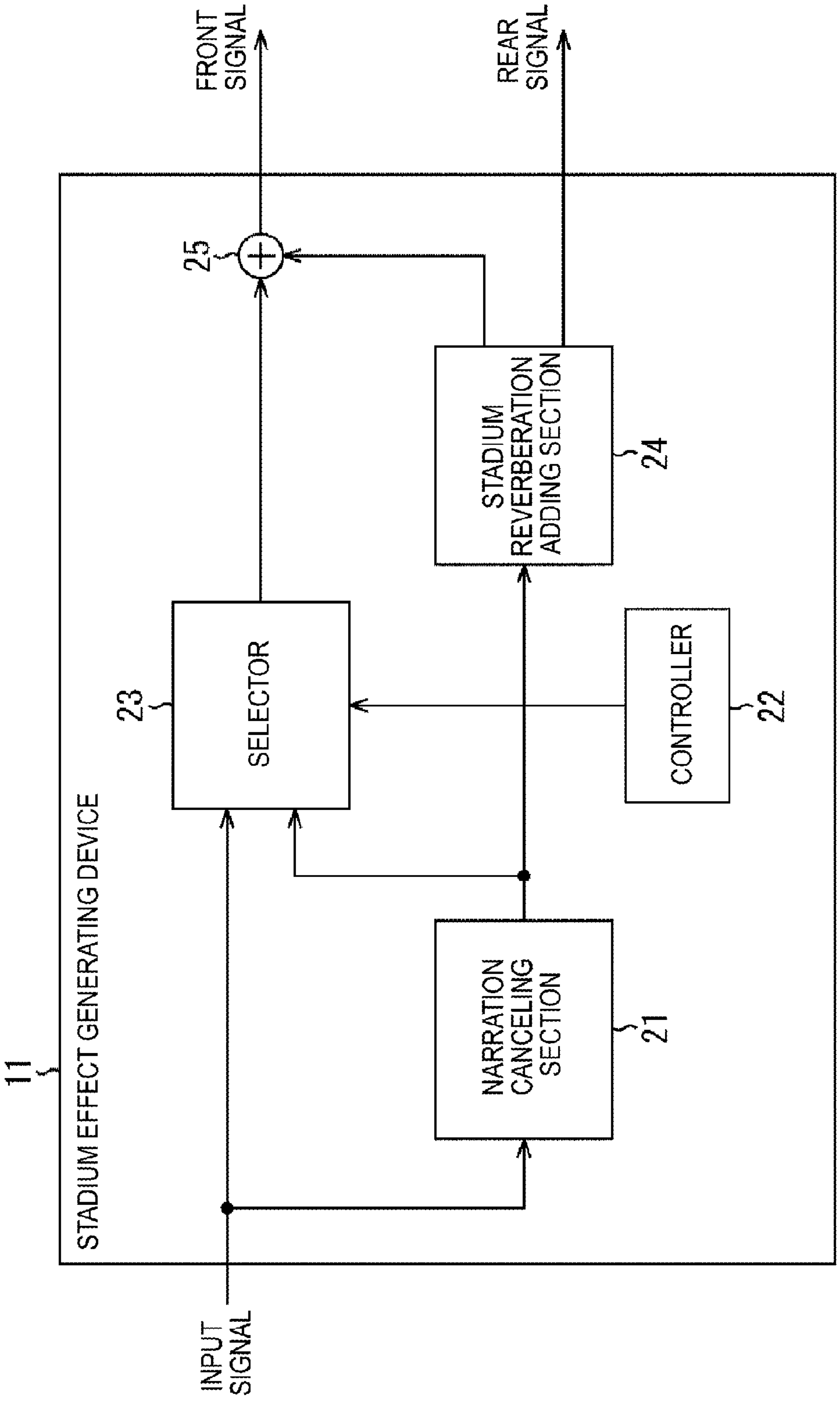
FIG. 1 is a diagram illustrating an exemplary configuration of a stadium effect generating device.

FIG. 1 is a diagram illustrating an exemplary configuration of an embodiment of a stadium effect generating device to which the present technique has been applied.

An audio signal of a soccer broadcast program, which is the contents of the processing object, is supplied to the stadium effect generating device 11 as an input signal. For example, the input signal is a two-channel stereo signal configured of an R-channel audio signal and an L-channel audio signal.

Hereinafter, the description will be continued while the input signal is an L and R two-channel stereo signal; however, the input signal may be a monaural signal or may be a multichannel signal with three or more channels. Furthermore, hereinafter, the R-channel or the L-channel audio signal configuring the input signal may also be referred to as an R-channel or an L-channel input signal.

By removing a narration from the supplied input signal and adding reverberation of a stadium, which is a soccer match venue, to the signal from which the narration has been removed, the stadium effect generating device 11 generates a stadium effect on the input signal. Accordingly, the audio signal output from the stadium effect generating device 11 is turned into an audio signal that enables a listener to have a sense of presence as if the listener is in a stadium.

The stadium effect generating device 11 includes a narration cancelling section 21, a controller 22, a selector 23, a stadium reverberation adding section 24, and an adding section 25.

By removing the narrative audio from the supplied input signal and by adding a pseudo-cheer component, which is a pseudo-cheer, to the input signal, the narration cancelling section 21 generates a narration canceling signal. The narration canceling signal is a stereo signal that is mainly configured of a component such as a cheer of a spectator that has remained after the narration had been removed from the original audio and an added pseudo-cheer component.

The narration cancelling section 21 supplies the narration canceling signal acquired from the input signal to the selector 23 and the stadium reverberation adding section 24.

In accordance with an input operation or the like of a user, for example, the controller 22 controls the output of the audio signal of the selector 23. In accordance with the control of the controller 22, the selector 23 supplies, to the adding section 25, either one of the supplied input signal and the narration canceling signal supplied from the narration cancelling section 21.

The stadium reverberation adding section 24 adds a reverberation effect of the stadium to the audio of the narration canceling signal by performing acoustic processing with a filter and the like on the narration canceling signal that has been supplied from the narration cancelling section 21. Note that the characteristics of the filter and the like that achieve the reverberation effect may be different per stadium.

The stadium reverberation adding section 24 outputs, to each of the adding section 25 and a subsequent loudspeaker and the like, a front signal and a rear signal acquired by adding reverberation to the narration canceling signal.

Note that the front signal is an audio signal in which the reproduction position of the audio, that is, the source location, is in front of the listener, and the rear signal is an audio signal in which the reproduction position of the audio is behind the listener. Furthermore, the front signal and the rear signal are also configured of two signals, namely, an R-channel and an L-channel.

The adding section 25 adds the input signal or the narration canceling signal that has been supplied from the selector 23 and the front signal that has been supplied from the stadium reverberation adding section 24 together to configure the final front signal and outputs the final front signal to the subsequent loudspeaker and the like.

Note that, herein, while an example has been described in which the signal acquired through the addition processing in the adding section 25 is set as the final front signal, the front signal acquired in the stadium reverberation adding section 24 may be set as the final front signal and may be directly output therefrom.

<Exemplary Configuration of Narration Cancellation Section>

Figure 2:
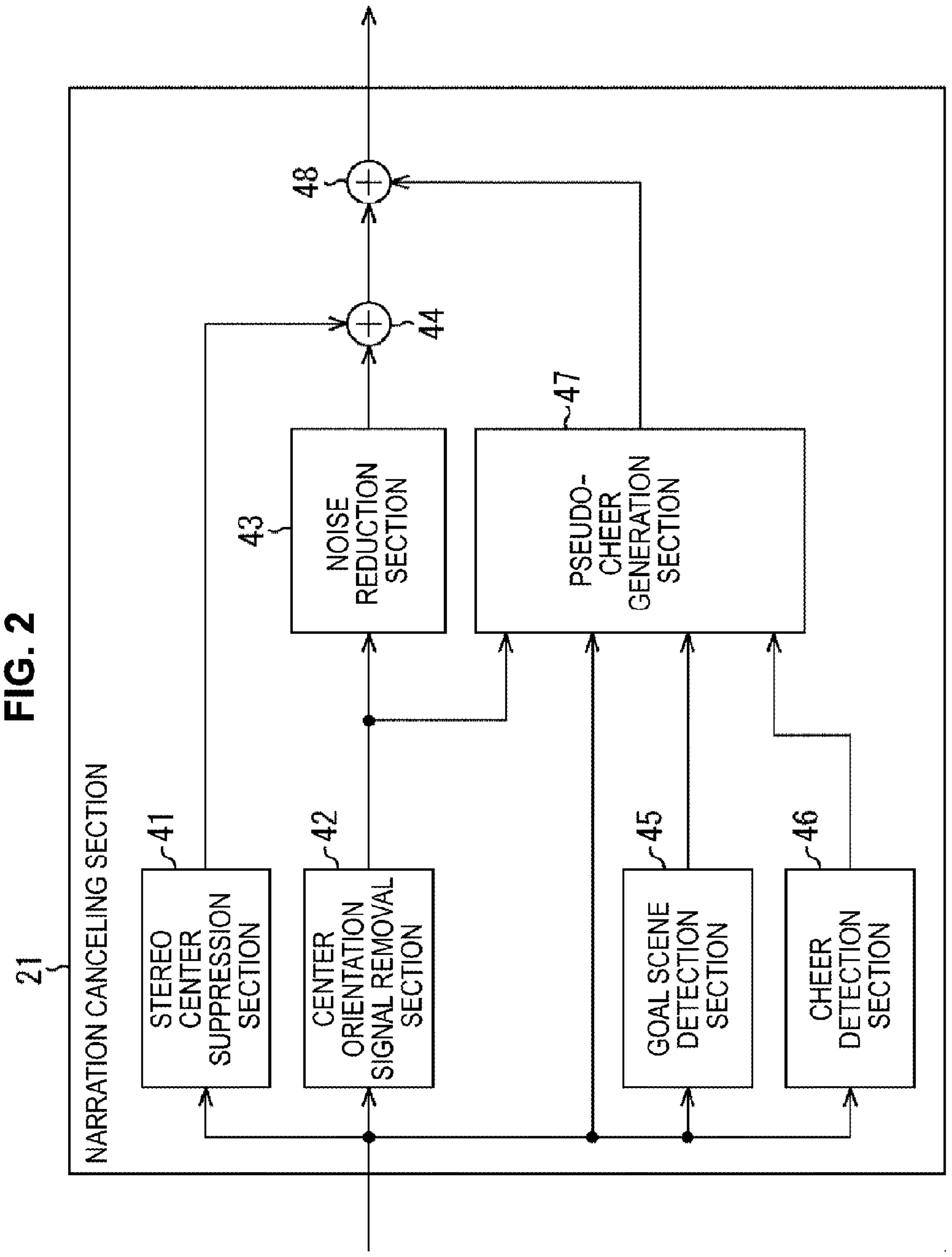
FIG. 2 is a diagram illustrating an exemplary configuration of a narration canceling section.

Furthermore, in more detail, the narration cancelling section 21 in FIG. 1 is configured in a manner illustrated in FIG. 2.

The narration cancelling section 21 includes a stereo center suppression section 41, a center orientation signal removal section 42, a noise reduction section 43, an adding section 44, a goal scene detection section 45, a cheer detection section 46, a pseudo-cheer generation section 47, and and an adding section 48.

The stereo center suppression section 41 suppresses the center orientation component of the R-channel and the L-channel of the supplied input signal to generate a stereo center suppression signal and supplies the stereo center suppression signal to the adding section 44.

In the stereo center suppression section 41, the center orientation component of the input signal, that is, the audio component oriented at the center with respect to the listener, is determined as the narration component, and the stereo signal acquired by suppressing the center orientation component of the input signal of each of the R and L-channels is determined as the stereo center suppression signal. The stereo center suppression signal acquired in the above manner is not a signal in which the narration component has been completely removed; however, since the stereo center suppression signal is a two-channel stereo signal, it is an audio signal with a sense of presence.

On the basis of the supplied input signal, the center orientation signal removal section 42 generates, as a center orientation removal signal, a monaural signal in which the center orientation component has been removed and supplies the center orientation removal signal to the noise reduction section 43 and the pseudo-cheer generation section 47. Since the center orientation removal signal that has been acquired in the above manner is a monaural signal, the center orientation removal signal is not a signal in which a sense of presence can be obtained in a sufficient manner; however, the center orientation removal signal is a signal in which the narration component has been removed in a sufficient manner.

The noise reduction section 43 removes a noise component from the center orientation removal signal supplied from the center orientation signal removal section 42 and supplies the resultant signal to the adding section 44. For example, there are cases in which noise is included particularly in the high range of the center orientation removal signal; accordingly, the noise reduction section 43 removes high range noise of the center orientation removal signal.

The adding section 44 adds the stereo center suppression signal from the stereo center suppression section 41 and the center orientation removal signal from the noise reduction section 43 together and supplies the resultant signal to the adding section 48.

The goal scene detection section 45 detects the goal scene, that is, the score scene, during the soccer match from the supplied input signal and supplies a goal scene detection signal indicating the detection result to the pseudo-cheer generation section 47.

Note that herein, while, in particular, a description has been given of an example in which the goal scene is detected as a distinct scene in the contents in which the volume of the narration component becomes relatively large, not limited to the goal scene, other scenes may be detected.

On the basis of the supplied input signal, the cheer detection section 46 detects a scene in which a cheer is occurring (hereinafter, also referred to as a cheer scene) and supplies a cheer detection signal indicating the detection result to the pseudo-cheer generation section 47.

The pseudo-cheer generation section 47 generates a pseudo-cheer signal that is the pseudo-cheer component on the basis of the supplied input signal, the center orientation removal signal from the center orientation signal removal section 42, the goal scene detection signal from the goal scene detection section 45, and the cheer detection signal from the cheer detection section 46 and supplies the pseudo-cheer signal to the adding section 48.

The adding section 48 adds the signal supplied from the adding section 44 and the pseudo-cheer signal supplied from the pseudo-cheer generation section 47 together to generate the narration canceling signal and supplies the narration canceling signal to the selector 23 and the stadium reverberation adding section 24.

<Exemplary Configuration of Stereo Center Suppression Section>

An exemplary configuration of the stereo center suppression section 41, the center orientation signal removal section 42, the noise reduction section 43, the goal scene detection section 45, the cheer detection section 46, and the pseudo-cheer generation section 47 that constitute the narration cancelling section 21 in FIG. 2 will be described next in detail.

Figure 3:
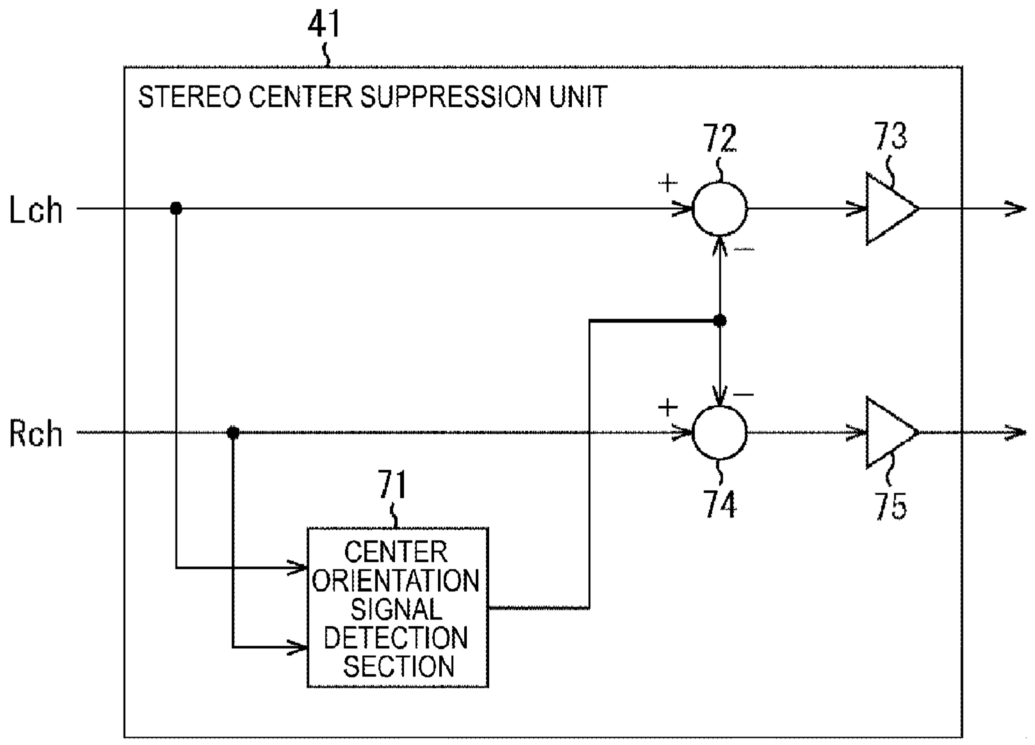
FIG. 3 is a diagram illustrating an exemplary configuration of a stereo center suppression section.

For example, in more detail, the stereo center suppression section 41 is configured in a manner illustrated in FIG. 3.

In FIG. 3, the stereo center suppression section 41 includes a center orientation signal detection section 71, a subtracting section 72, an amplification section 73, a subtracting section 74, and an amplification section 75.

On the basis of the supplied L-channel and R-channel input signals, the center orientation signal detection section 71 detects the center orientation components of the input signals and supplies the detected signals to the subtracting section 72 and the subtracting section 74.

The subtracting section 72 subtracts the center orientation component supplied from the center orientation signal detection section 71 from the supplied L-channel input signal and supplies the acquired signal to the amplification section 73 as an L-channel signal of the stereo center suppression signal. Not that the L-channel signal of the stereo center suppression signal is also referred to as an L-channel stereo center suppression signal.

The amplification section 73 amplifies the L-channel stereo center suppression signal supplied from the subtracting section 72 and supplies the amplified signal to the adding section 44.

The subtracting section 74 subtracts the center orientation component supplied from the center orientation signal detection section 71 from the supplied R-channel input signal and supplies the acquired signal to the amplification section 75 as an R-channel signal of the stereo center suppression signal. Not that the R-channel signal of the stereo center suppression signal is also referred to as an R-channel stereo center suppression signal.

The amplification section 75 amplifies the R-channel stereo center suppression signal supplied from the subtracting section 74 and supplies the amplified signal to the adding section 44.

<Exemplary Configuration of Center Localization Signal Removal Section>

Figure 4:
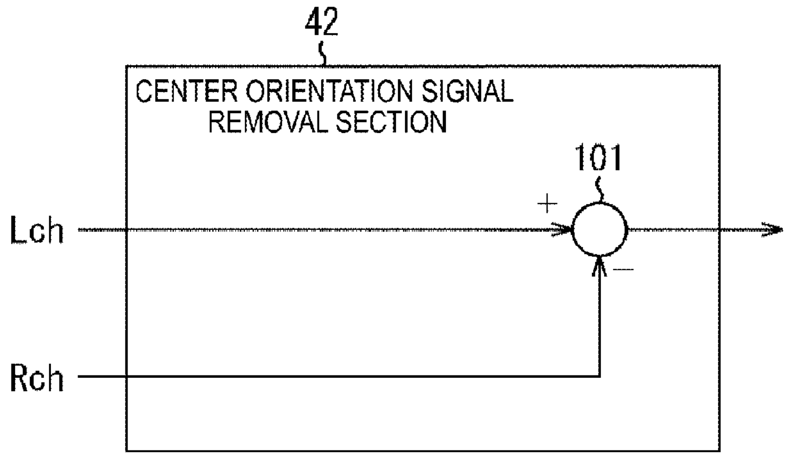
FIG. 4 is a diagram illustrating an exemplary configuration of a center orientation signal removal section.

Furthermore, the center orientation signal removal section 42 is configured in a manner illustrated in FIG. 4, for example.

The center orientation signal removal section 42 includes a subtracting section 101. The subtracting section 101 subtracts the supplied R-channel input signal from the supplied L-channel input signal and supplies the resultant center orientation removal signal to the noise reduction section 43 and the pseudo-cheer generation section 47.

<Exemplary Configuration of Noise Reduction Section>

Figure 5:
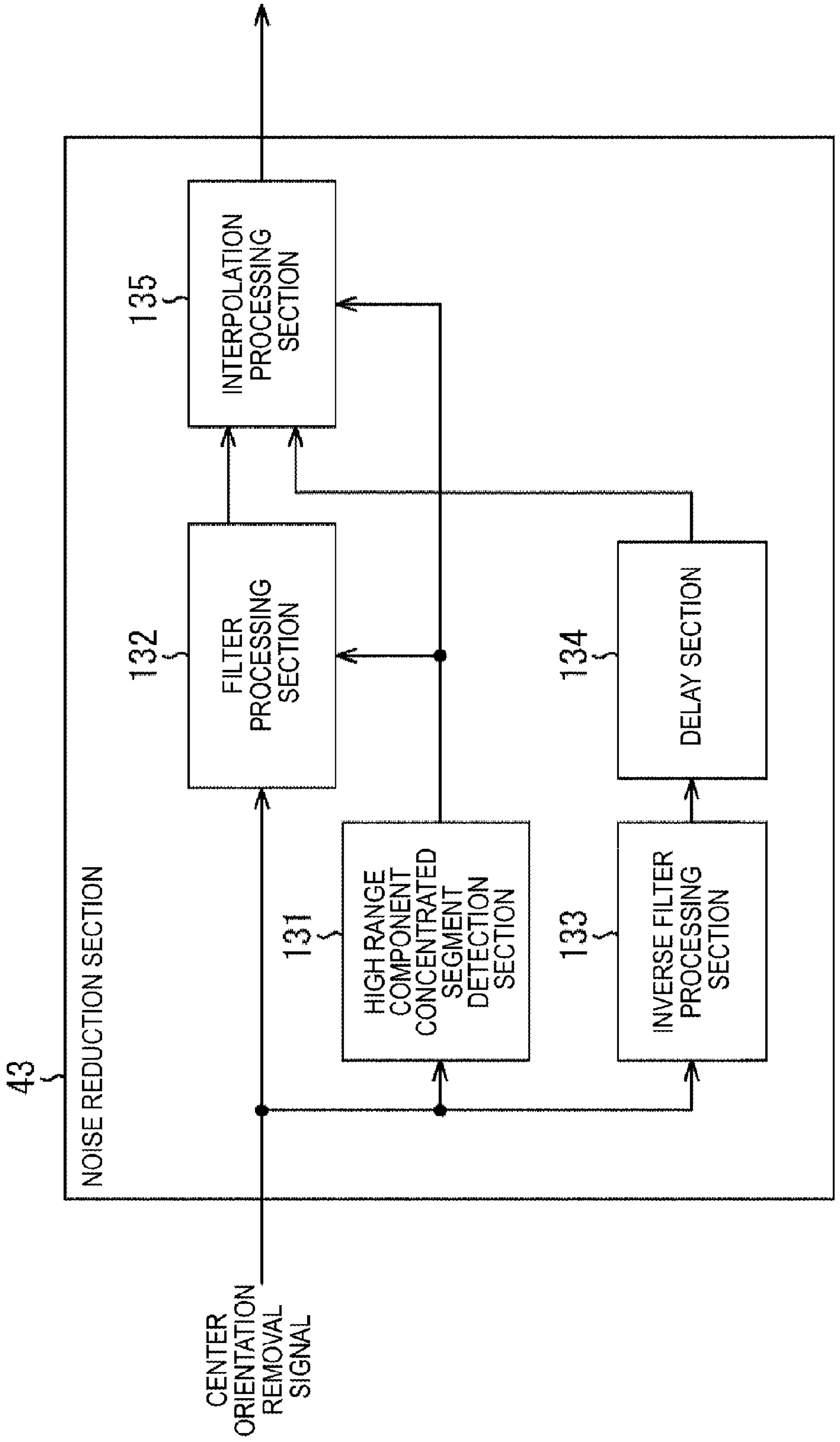
FIG. 5 is a diagram illustrating an exemplary configuration of a noise reduction section.

Furthermore, the noise reduction section 43 is configured in a manner illustrated in FIG. 5, for example.

The noise reduction section 43 includes a high range component concentrated segment detection section 131, a filter processing section 132, an inverse filter processing section 133, a delay section 134, and an interpolation processing section 135.

On the basis of the center orientation removal signal supplied from the subtracting section 101, the high range component concentrated segment detection section 131 detects a segment (hereinafter, referred to as a high range component concentrated segment) where energy concentrates in the high range of the center orientation removal signal. Furthermore, the high range component concentrated segment detection section 131 supplies a high range component concentrated segment detection signal that indicates the detection result to the filter processing section 132 and the interpolation processing section 135.

On the basis of the high range component concentrated segment detection signal supplied from the high range component concentrated segment detection section 131, the filter processing section 132 performs filter processing on the center orientation removal signal supplied from the subtracting section 101 and supplies the resultant signal to the interpolation processing section 135. In the filter processing section 132, a high range component of the center orientation removal signal in the high range component concentrated segment is determined as a noise component and the high range component in the high range component concentrated segment of the center orientation removal signal is suppressed through filter processing.

The inverse filter processing section 133 using a filter (hereinafter, referred to as an inverse filter) that has a reverse characteristic with respect to the filter included in the filter processing section 132 performs filter processing on the center orientation removal signal supplied from the subtracting section 101 and supplies the resultant signal to the delay section 134. With the filter processing using the inverse filter, a low range component of the center orientation removal signal is removed such that only the high range component is extracted.

The delay section 134 delays the audio signal supplied from the inverse filter processing section 133 by a predetermined time and supplies the audio signal to the interpolation processing section 135.

On the basis of the high range component concentrated segment detection signal from the high range component concentrated segment detection section 131 and the audio signal from the delay section 134, the interpolation processing section 135 performs interpolation processing on the audio signal supplied from the filter processing section 132 and supplies the resultant audio signal to the adding section 44. In the interpolation processing, the high range component that has been removed from the center orientation removal signal is interpolated and, as a result, a center orientation removal signal in which noise has been reduced is acquired.

Note that when reducing the noise of the center orientation removal signal in the noise reduction section 43, the input signal may be used.

<Exemplary Configuration of Goal Scene Detection Section>

Figure 6:
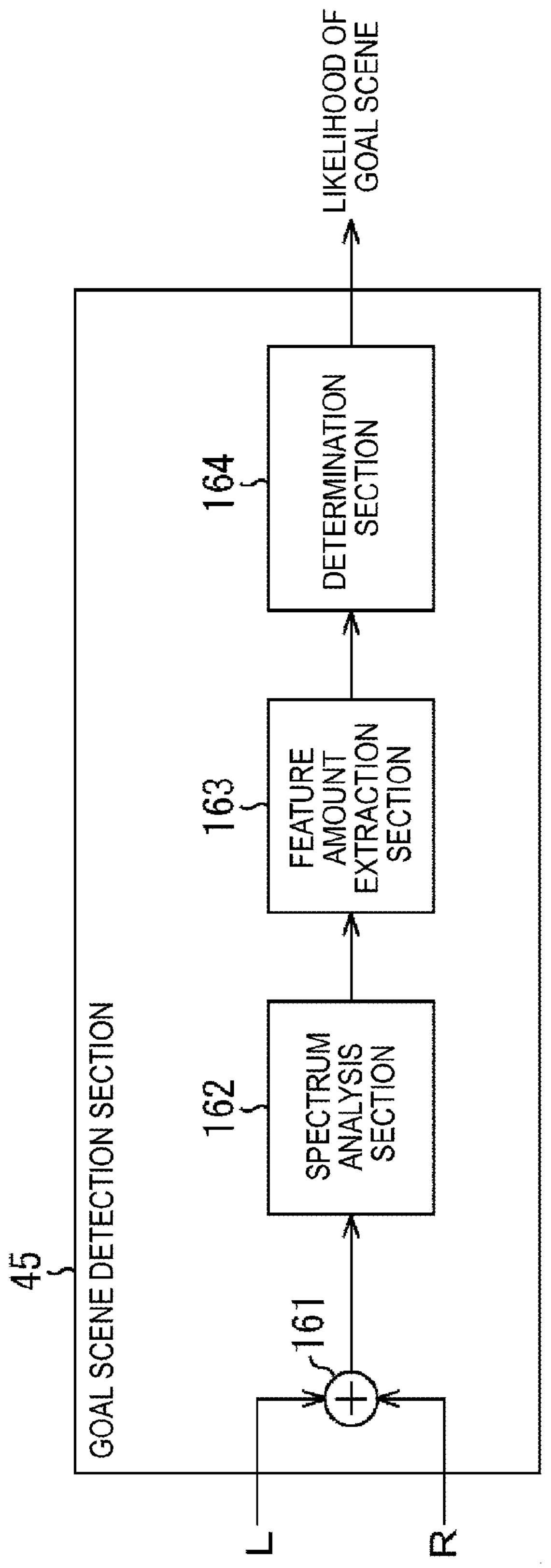
FIG. 6 is a diagram illustrating an exemplary configuration of a goal scene detection section.

Furthermore, the goal scene detection section 45 is configured in a manner illustrated in FIG. 6, for example.

In FIG. 6, the goal scene detection section 45 includes an adding section 161, a spectrum analysis section 162, a feature amount extraction section 163, and a determination section 164.

The adding section 161 adds the supplied L-channel input signal and the supplied R-channel input signal together and supplies the resultant signal to the spectrum analysis section 162. The spectrum analysis section 162 performs spectrum analysis on the input signal that has been supplied from the adding section 161 and on which adding has been performed and supplies the resultant spectrum to the feature amount extraction section 163. For example, the spectrum analysis is performed by filter processing using a band pass filter (BPF), by fast fourier transform (FFT), or the like.

The feature amount extraction section 163 extracts a feature amount from the spectrum supplied from the spectrum analysis section 162 and supplies the feature amount to the determination section 164.

The determination section 164 detects the goal scene from the input signal by performing a linear identification or the like on the basis of the feature amount supplied from the feature amount extraction section 163. The determination section 164 supplies the goal scene detection signal that indicates the detection result of the goal scene to the pseudo-cheer generation section 47.

<Exemplary Configuration of Cheer Detection Section>

Figure 7:
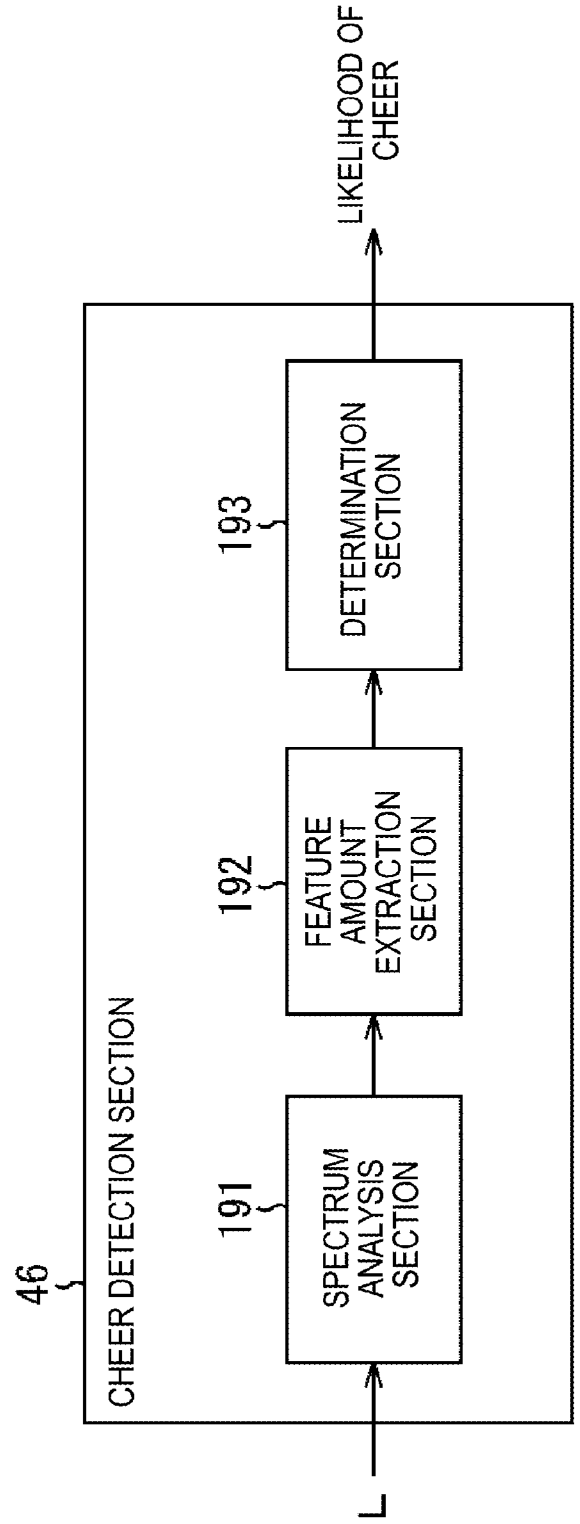
FIG. 7 is a diagram illustrating an exemplary configuration of a cheer detection section.

Furthermore, the cheer detection section 46 is configured in a manner illustrated in FIG. 7, for example.

In FIG. 7, the cheer detection section 46 includes a spectrum analysis section 191, a feature amount extraction section 192, and a determination section 193.

The spectrum analysis section 191 performs spectrum analysis on the L-channel input signal among the supplied input signals and supplies the resultant spectrum to the feature amount extraction section 192. For example, the spectrum analysis is performed by filter processing using BPF, by FFT, or the like.

Note that herein, while the description is given of an example in which the spectrum analysis is performed on the L-channel input signal, the spectrum analysis may be performed on the R-channel input signal. Furthermore, the spectrum analysis may be performed on a signal that is acquired by subtracting the R-channel input signal from the L-channel input signal.

The feature amount extraction section 192 extracts a feature amount from the spectrum supplied from the spectrum analysis section 191 and supplies the feature amount to the determination section 193.

The determination section 193 detects a cheer scene from the input signal by performing a linear identification or the like on the basis of the feature amount supplied from the feature amount extraction section 192 and supplies a cheer detection signal indicating the detection result to the pseudo-cheer generation section 47.

<Exemplary Configuration of Pseudo-Cheer Generation Section>

Figure 8:
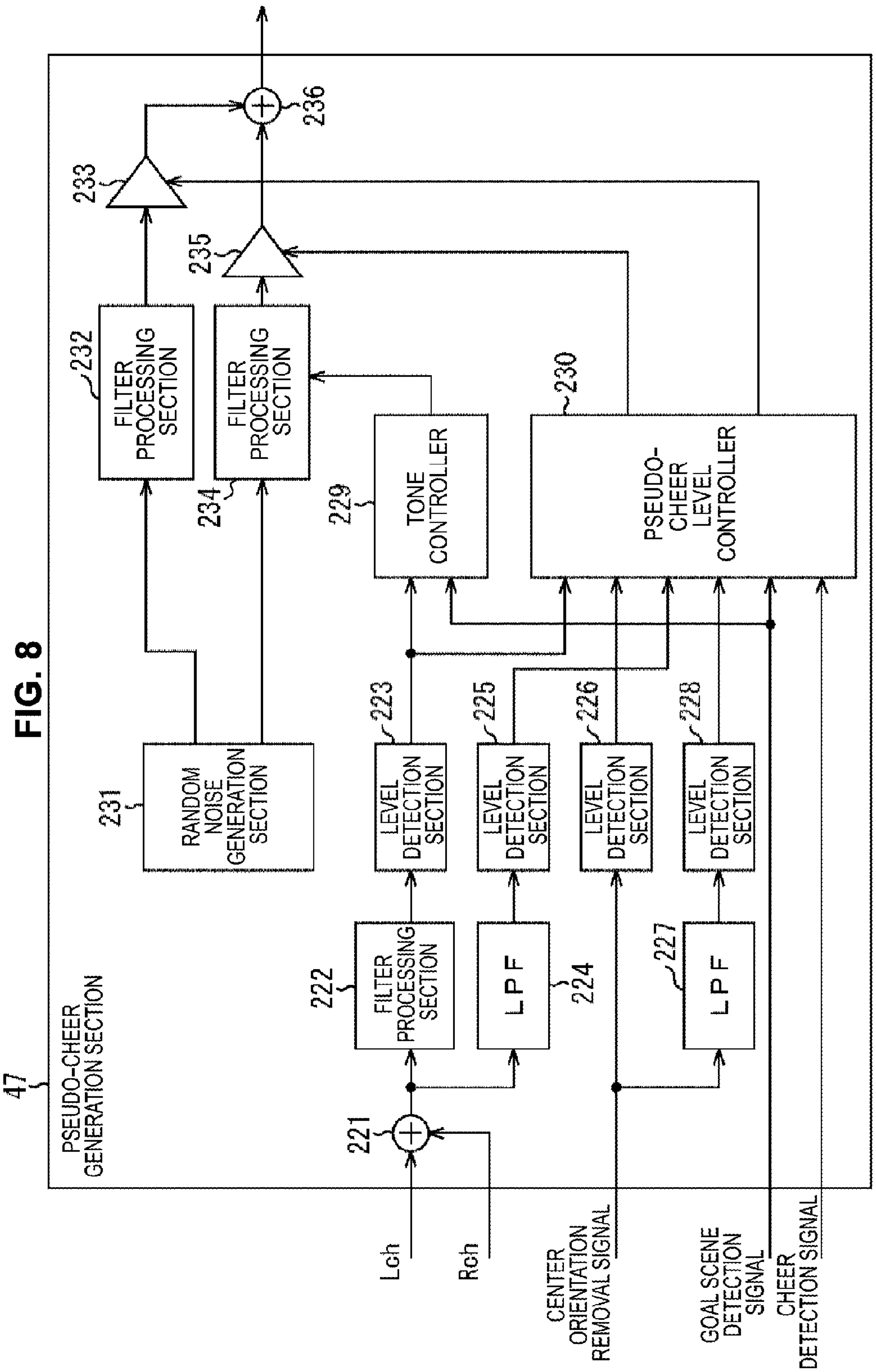
FIG. 8 is a diagram illustrating an exemplary configuration of a pseudo-cheer generation section.

Furthermore, the pseudo-cheer generation section 47 in FIG. 2 is configured in a manner illustrated in FIG. 8, for example.

The pseudo-cheer generation section 47 illustrated in FIG. 8 includes an adding section 221, a filter processing section 222, a level detection section 223, a low pass filter (LPF) 224, a level detection section 225, a level detection section 226, an LPF 227, a level detection section 228, a tone controller 229, a pseudo-cheer level controller 230, a random noise generation section 231, a filter processing section 232, an amplification section 233, a filter processing section 234, an amplification section 235, and an adding section 236.

The adding section 221 adds the supplied L-channel input signal and the supplied R-channel input signal together and supplies the resultant signal to the filter processing section 222 and the LPF 224.

The filter processing section 222 performs filter processing on the input signal supplied from the adding section 221 using a filter for removing human voice, more specifically, narration, and supplies the resultant signal to the level detection section 223.

The filter used by the filter processing section 222 is, for example, a BPF that removes a middle range component of the input signal or a high pass filter (an HPF) that removes a human voice band.

The level detection section 223 detects a level (hereinafter, also referred to as a detection level A1) of the signal supplied from the filter processing section 222 and supplies the detection result to the tone controller 229 and the pseudo-cheer level controller 230. The detection level A1 acquired in the level detection section 223 is a level associated with a middle to high range component of the input signal.

The LPF 224 performs filter processing using the LPF on the input signal supplied from the adding section 221 and supplies the resultant signal to the level detection section 225. The level detection section 225 detects a level (hereinafter, also referred to as a detection level A2) of the signal supplied from the LPF 224 and supplies the detection result to the pseudo-cheer level controller 230. The detection level A2 acquired in the level detection section 225 is a level associated with a low range component of the input signal.

The level detection section 226 detects a level (hereinafter, also referred to as a detection level B1) of the center orientation removal signal supplied from the subtracting section 101 of the center orientation signal removal section 42 and supplies the detection result to the pseudo-cheer level controller 230.

The LPF 227 performs filter processing using the LPF on the center orientation removal signal supplied from the subtracting section 101 and supplies the resultant signal to the level detection section 228. The level detection section 228 detects a level (hereinafter, also referred to as a detection level B2) of the signal supplied from the LPF 227 and supplies the detection result to the pseudo-cheer level controller 230. The detection level B2 acquired in the level detection section 228 is a level associated with a low range component of the center orientation removal signal.

On the basis of the detection level A1 from the level detection section 223 and the goal scene detection signal from the determination section 164 of the goal scene detection section 45, the tone controller 229 controls the filter processing of the filter processing section 234.

On the basis of the detection level A1 from the level detection section 223, the detection level B1 from the level detection section 226, the goal scene detection signal from the determination section 164, and the cheer detection signal from the determination section 193 of the cheer detection section 46, the pseudo-cheer level controller 230 controls amplification processing of the amplification section 235.

Furthermore, on the basis of the detection level A2 from the level detection section 225, the detection level B2 from the level detection section 228, the goal scene detection signal from the determination section 164, and the cheer detection signal from the determination section 193, the pseudo-cheer level controller 230 controls amplification processing of the amplification section 233.

The random noise generation section 231 generates a random noise signal configured of a random noise component and supplies the random noise signal to the filter processing section 232 and the filter processing section 234.

The filter processing section 232 generates a pseudo-cheer signal by performing filter processing using a filter such as the LPF on the random noise signal supplied from the random noise generation section 231 and supplies the pseudo-cheer signal to the amplification section 233. For example, the pseudo-cheer signal acquired in the filter processing section 232 is an audio signal including only a low range component having low frequency such as a sound close to rumbling of the earth occurring in the stadium that is the match venue.

In accordance with the control of the pseudo-cheer level controller 230, the amplification section 233 amplifies the pseudo-cheer signal supplied from the filter processing section 232 and supplies the resultant signal to the adding section 236.

In accordance with the control of the tone controller 229, the filter processing section 234 varies the filter and performs filter processing using the filter on the random noise signal supplied from the random noise generation section 231 to generate a pseudo-cheer signal and supplies the pseudo-cheer signal to the amplification section 235.

For example, by varying the filter, the filter processing section 234 controls the tone of the generated pseudo-cheer signal. The pseudo-cheer signal acquired in the filter processing section 234 is an audio signal including only a high to middle range component having a relatively high frequency such as a cheer of a spectator occurring in the stadium.

In accordance with the control of the pseudo-cheer level controller 230, the amplification section 235 amplifies the pseudo-cheer signal supplied from the filter processing section 234 and supplies the resultant signal to the adding section 236.

The adding section 236 adds the pseudo-cheer signal supplied from the amplification section 233 and the pseudo-cheer signal supplied from the amplification section 235 together and supplies the resultant and final pseudo-cheer signal to the adding section 48 of the narration cancelling section 21.

<Exemplary Configuration of Pseudo-Cheer Level Controller>

Figure 9:
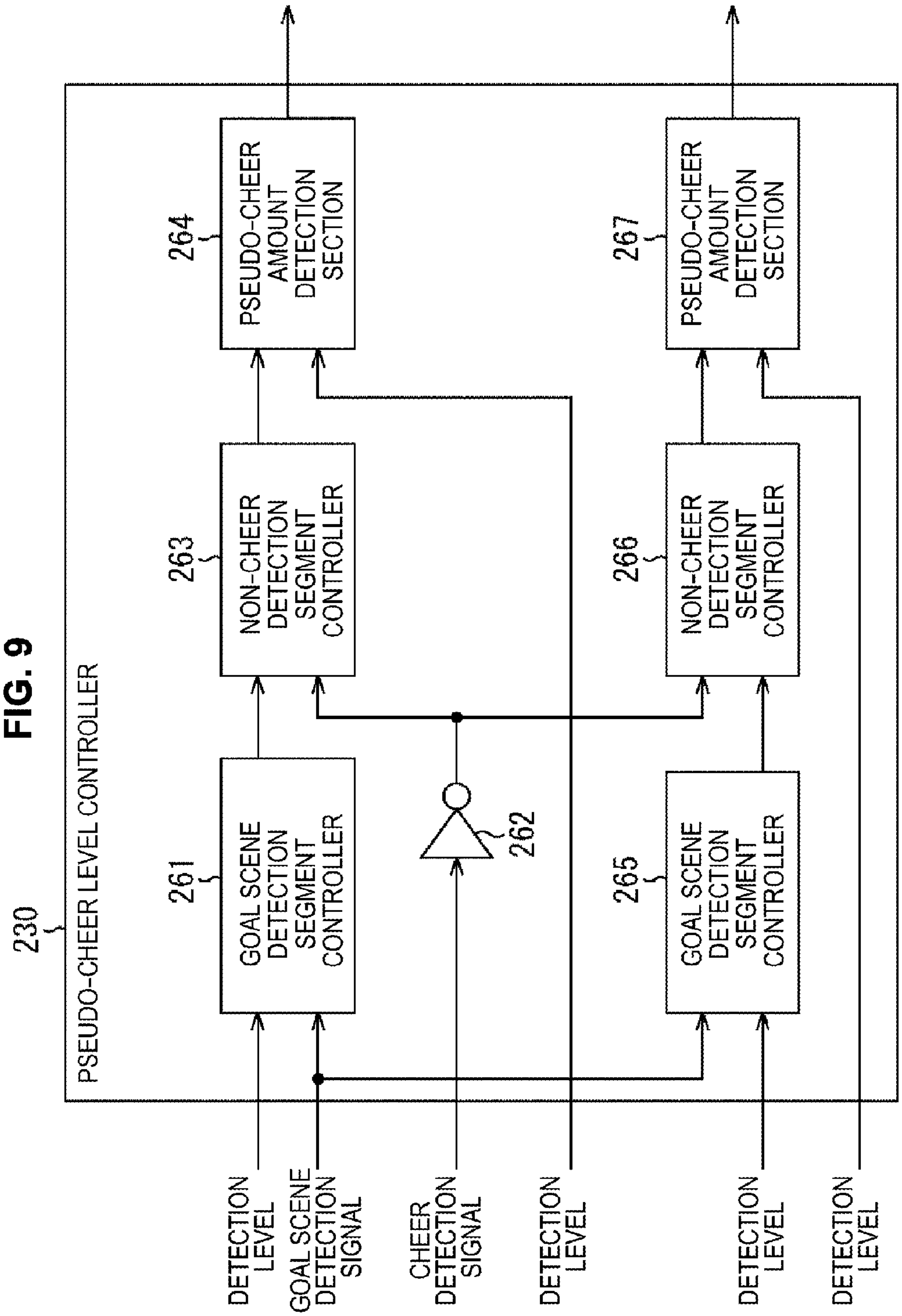
FIG. 9 is a diagram illustrating an exemplary configuration of a pseudo-cheer level controller.

Furthermore, in more detail, the pseudo-cheer level controller 230 in FIG. 8 is configured in a manner illustrated in FIG. 9, for example.

In FIG. 9, the pseudo-cheer level controller 230 includes a goal scene detection segment controller 261, a non-cheer detection section 262, a non-cheer detection segment controller 263, a pseudo-cheer amount detection section 264, a goal scene detection segment controller 265, a non-cheer detection segment controller 266, and a pseudo-cheer amount detection section 267.

On the basis of the goal scene detection signal from the determination section 164, the goal scene detection segment controller 261 performs level adjustment of the detection level A1 from the level detection section 223 and supplies the resultant detection level A1 to the non-cheer detection segment controller 263.

On the basis of the cheer detection signal supplied from the determination section 193, the non-cheer detection section 262 detects a segment that is not a cheer scene as a non-cheer scene (a non-cheer segment) and supplies the detection result to the non-cheer detection segment controller 263 and the non-cheer detection segment controller 266.

For example, the non-cheer detection section 262 is configured of an inverter and generates a non-cheer detection signal that indicates a non-cheer scene by inverting the cheer detection signal.

On the basis of the non-cheer detection signal from the non-cheer detection section 262, the non-cheer detection segment controller 263 performs level adjustment of the detection level A1 supplied from the goal scene detection segment controller 261 and supplies the resultant detection level A1 to the pseudo-cheer amount detection section 264.

The pseudo-cheer amount detection section 264 determines the pseudo-cheer amount, which is an amplification amount of the pseudo-cheer signal, by comparing the detection level A1 supplied from the non-cheer detection segment controller 263 with the detection level B1 supplied from the level detection section 226 and, on the basis of the pseudo-cheer amount, controls the amplification section 235.

On the basis of the goal scene detection signal from the determination section 164, the goal scene detection segment controller 265 performs level adjustment of the detection level A2 from the level detection section 225 and supplies the resultant detection level A2 to the non-cheer detection segment controller 266.

On the basis of the non-cheer detection signal from the non-cheer detection section 262, the non-cheer detection segment controller 266 performs level adjustment of the detection level A2 supplied from the goal scene detection segment controller 265 and supplies the resultant detection level A2 to the pseudo-cheer amount detection section 267.

The pseudo-cheer amount detection section 267 determines the pseudo-cheer amount, which is an amplification amount of the pseudo-cheer signal, by comparing the detection level A2 supplied from the non-cheer detection segment controller 266 with the detection level B2 supplied from the level detection section 228 and, on the basis of the pseudo-cheer amount, controls the amplification section 233.

<Description of the Stadium Effect Generating Process>

Incidentally, when an input signal is supplied to the stadium effect generating device 11 and a command to add a stadium effect to the input signal is issued, the stadium effect generating device 11 performs stadium effect generating processing and outputs a front signal and a rear signal.

Hereinafter, referring to a flowchart in FIG. 10, the stadium effect generating processing performed by the stadium effect generating device 11 will be described.

In step S11, the stereo center suppression section 41 generates a stereo center suppression signal on the basis of the supplied input signal.

For example, the center orientation signal detection section 71 compares the level and the phase of the L-channel input signal with those of the R-channel input signal and, when the levels and the phases of the input signals of the channels are the same, determines that center orientation components are included in the input signals. Then, the center orientation signal detection section 71 extracts the common components in the L-channel input signal and the R-channel input signal as the center orientation components and supplies the center orientation components to the subtracting section 72 and the subtracting section 74.

The subtracting section 72 and the subtracting section 74 subtract the center orientation components from the center orientation signal detection section 71 from the supplied L-channel input signal and the supplied R-channel input signal and supply the resultant stereo center suppression signals to the amplification section 73 and the amplification section 75.

The amplification section 73 and the amplification section 75 perform level adjustments of the L-channel stereo center suppression signal and the R-channel stereo center suppression signal that have been supplied from the subtracting section 72 and the subtracting section 74 and supply the resultant signals to the adding section 44. The above level adjustments are performed such that the levels of the stereo center suppression signals become appropriate with respect to the level of a center orientation removal signal.

In step S12, the center orientation signal removal section 42 generates a center orientation removal signal on the basis of the supplied input signals. In other words, the subtracting section 101 subtracts the R-channel input signal from the L-channel input signal to generate a center orientation removal signal and supplies the center orientation removal signal to the noise reduction section 43 and the pseudo-cheer generation section 47.

In step S13, the noise reduction section 43 performs noise reduction processing on the center orientation removal signal that has been supplied from the subtracting section 101 and supplies the resultant center orientation removal signal to the adding section 44.

Figure 11:
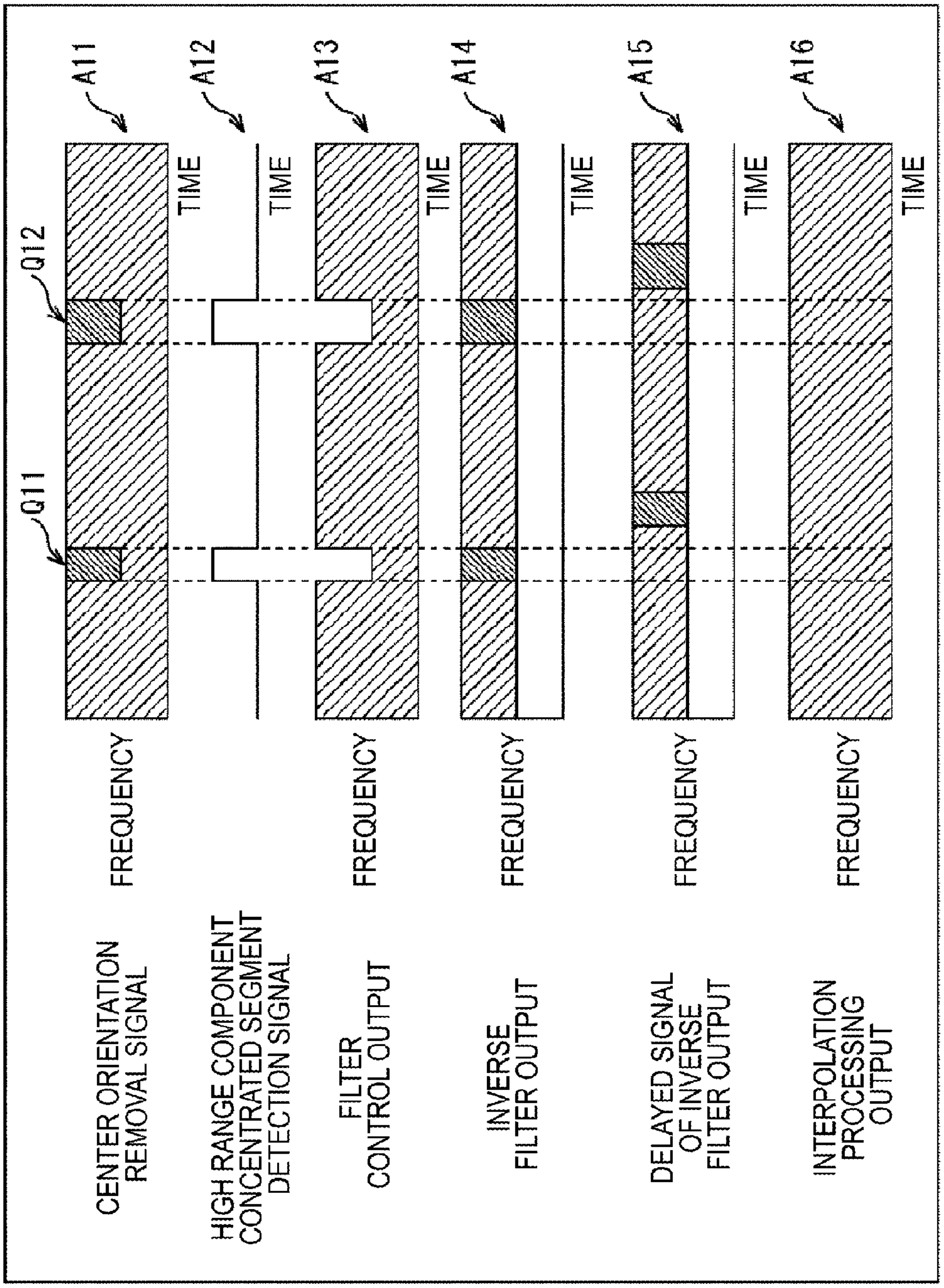
FIG. 11 is a diagram for describing a reduction of noise.

For example, as indicated by arrow A11 in FIG. 11, assume that noise is included in the high range component in a partial segment of the center orientation removal signal.

Note that in FIG. 11, arrows A11 to A16 respectively indicate the center orientation removal signal, the high range component concentrated segment detection signal, an output of the filter processing section 132, an output of the inverse filter processing section 133, an output of the delay section 134, and the center orientation removal signal on which noise reduction has been performed. Furthermore, in each of the signals indicated by arrow A11 and arrows A13 to A16, the horizontal direction indicates time and the vertical direction indicates frequency. Furthermore, the light and shade in areas of each signal indicated by arrow A11 and arrows A13 to A16 indicate the power of frequency at each time instance. The power of an area becomes larger as the density of the area becomes higher.

In the example in FIG. 11, the powers of the areas indicated by arrows Q11 and Q12 in the center orientation removal signal indicated by arrow A11 are larger than the powers of the other areas.

By referring to, for example, the powers of each frequency of the center orientation removal signal indicated by arrow A11, the high range component concentrated segment detection section 131 detects the segment including the areas indicated by arrows Q11 and Q12 in the center orientation removal signal as the high range component concentrated segments. Then, the high range component concentrated segment detection section 131 supplies, as the detection result, the high range component concentrated segment detection signal indicated by arrow A12 to the filter processing section 132 and the interpolation processing section 135.

In the high range component concentrated segment detection signal indicated by arrow A12, the level of the signal illustrated in the vertical direction in the figure is formed so as to project upwards in the segments including the areas indicated by arrows Q11 and Q12, and, accordingly, indicates that the segments are high range component concentrated segments.

Note that in the above example, while the high range component concentrated segment detection signal indicates whether each segment is a high range component concentrated segment, the high range component concentrated segment detection signal may be a value that indicates the level of high range component concentrated segment certainty of each segment.

Furthermore, the filter processing section 132, using the filter kept therein, performs filter processing on the center orientation removal signal from the subtracting section 101 in the high range component concentrated segments indicated by the high range component concentrated segment detection signal supplied from the high range component concentrated segment detection section 131.

With the above, as indicated by arrow A13, the high range components in the high range component concentrated segments of the center orientation removal signal are suppressed. In other words, noise is reduced.

The center orientation removal signal acquired in the above manner is supplied to the interpolation processing section 135 from the filter processing section 132. Note that while the center orientation removal signal indicated by arrow A13 is a signal in which noise has been reduced, the power of the high range component in the high range component concentrated segment becomes, disadvantageously, low. Accordingly, interpolation processing is performed on the center orientation removal signal illustrated by arrow A13.

In other words, the inverse filter processing section 133, using the inverse filter kept therein, performs filter processing on the center orientation removal signal supplied from the subtracting section 101 and supplies the resultant signal to the delay section 134. With the filter processing using the inverse filter, as indicated by arrow A14, a low range component in each time instance of the center orientation removed signal is removed such that only the high range component is extracted.

Then, when the delay section 134 delays the signal supplied from the inverse filter processing section 133 by a predetermined time and supplies the signal to the interpolation processing section 135, as indicated by arrow A15, a signal in which the areas of the high range portions where energy concentrates are shifted in the time direction is obtained. In the signal acquired in the above manner, the high range areas of the high range component concentrated segments indicated by the high range component concentrated segment detection signal are not areas where energy concentrates. In other words, the areas are signal components with no noise included therein.

Then, the interpolation processing section 135 performs interpolation by adding the areas of the high range portions of the high range component concentrated segments in the signal from the delay section 134 to areas of the high range portions of the high range component concentrated segments indicated by the high range component concentrated segment detection signal in the signal supplied from the filter processing section 132.

With the above, a signal indicated by arrow A16, for example, is obtained as the center orientation removal signal in which noise has been reduced. The interpolation processing section 135 supplies the center orientation removal signal acquired by interpolation processing to the adding section 44.

The adding section 44 adds the center orientation removal signal from the interpolation processing section 135 to each of the L-channel stereo center suppression signal from the amplification section 73 and the R-channel stereo center suppression signal from the amplification section 75 and supplies the resultant signals to the adding section 48. With the above, a stereo signal configured of the L-channel and the R-channel in which the narrations of the input signals have been removed is supplied to the adding section 48.

As described above, by adding a stereo center suppression signal that, although the narration components are not completely removed, has a sense of presence and a center orientation removal signal in which, although with no sense of presence, the narration has been removed together, a signal in which the narration has been virtually removed and that has a sense of presence can be acquired.

Figure 10:
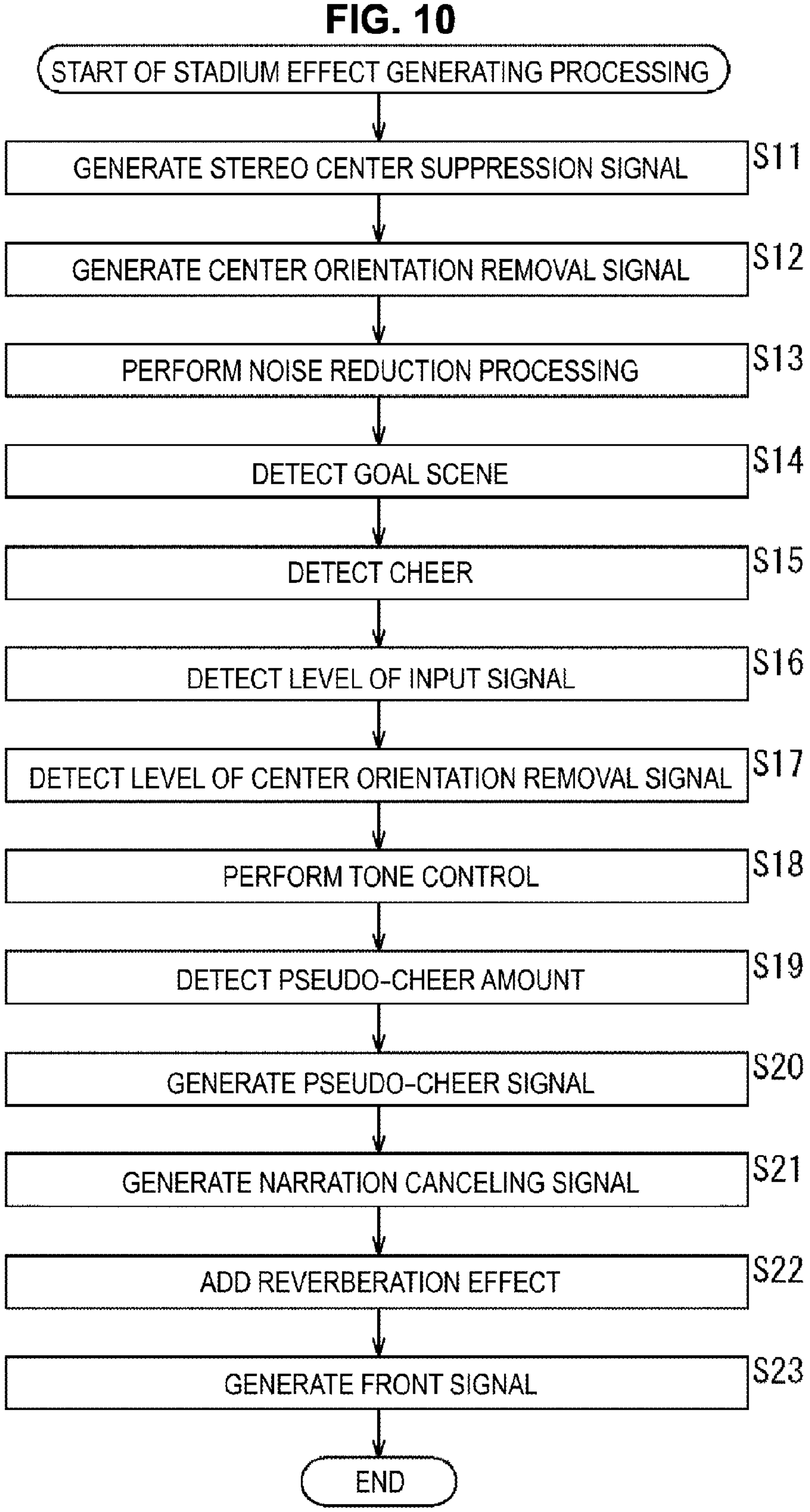
FIG. 10 is a flowchart for describing a stadium effect generating processing.

Returning back to the description of the flowchart in FIG. 10, in step S14, on the basis of the supplied input signals, the goal scene detection section 45 detects a goal scene. For example, a goal scene is detected by detecting, from the input signal, the word "goal" that is included as a narration and that has been uttered by a commentator or the like.

Specifically, the adding section 161 adds the supplied L-channel input signal and the supplied R-channel input signal together and supplies the resultant signal to the spectrum analysis section 162. By adding the L-channel input signal and the R-channel input signal together, the center orientation component, in other words, the narration component, becomes larger and the detection accuracy of the desired word included in the input signal as a narration can be improved. Furthermore, the spectrum analysis section 162 performs spectrum analysis on the input signal from the adding section 161 and supplies the acquired spectrum to the feature amount extraction section 163.

On the basis of the spectrum supplied from the spectrum analysis section 162, the feature amount extraction section 163 calculates the feature amounts indicating the change amount of the spectral shape and the degree of the peak of the spectrum and supplies the feature amounts to the determination section 164.

For example, the spectral shape changes drastically in a normal narration; however, when the word "goal" is included as a narration, the spectral shape does not change much. Furthermore, when the word "goal" is included as a narration, in the spectrum, a sharp peak occurs in the frequency unique to the speaker of the word.

With the above, the goal scene detection section 45 calculates the change amount of the spectral shape and the degree of the peak of the spectrum as feature amounts and, on the basis of the feature amounts, detects the goal scene from the input signal. In other words, a likelihood of being a goal scene is calculated.

Specifically, on the basis of the feature amounts from the feature amount extraction section 163, the determination section 164 performs a linear identification or the like to detect the goal scene and supplies the goal scene detection signal indicating the detection result to the pseudo-cheer generation section 47.

Note that the goal scene detection signal may be a signal that indicates whether there is a likelihood of a goal scene; however, the goal scene detection signal may be a multi-value signal indicating the degree of likelihood of a goal scene.

In step S15, the cheer detection section 46 detects a cheer from the supplied input signal.

In other words, the spectrum analysis section 191 performs spectrum analysis on the supplied L-channel input signal and supplies the resultant spectrum to the feature amount extraction section 192. The feature amount extraction section 192 extracts feature amounts from the spectrum supplied from the spectrum analysis section 191 and supplies the feature amount to the determination section 193.

For example, as the feature amounts, a rate of the low range level with respect to the band level of the entire input signal, a rate of the high range level with respect to the band level of the entire input signal, a rate of the cheer band level with respect to the band level of the entire input signal, and the manner in which the peak rises up in the spectrum are calculated.

Note that the rate of each of the low range level, the high range level, and the cheer band level with respect to the entire band level that has been calculated as a feature amount is used to specify whether the spectral shape of the input signal has a spectral shape unique to a cheer.

For example, when the low range level and the high range level are large with respect to the level of the entire band, there is a high possibility that the audio based on the input signal is an audio having a large sound such as music that is different from a cheer of a person; accordingly, in such a case, the input signal is determined that it has no likelihood of a cheer scene.

Furthermore, when the cheer band level is large with respect to the level the entire band, there is a high possibility that a cheer is included in the audio based on the input signal; accordingly, in such a case, the input signal is determined that it has a likelihood of a cheer scene. However, when a narration is included in the input signal, a sharp peak appears at a position of the frequency related to the narration; accordingly, in the spectrum, the component of the frequency in which a sharp peak has appeared is excluded from the calculation of the cheer band level.

Furthermore, the spectrum of a scene in which a cheer is occurring is the spectrum with a smooth shape without any sharp peaks. Conversely, in a scene in which music such as a commercial message (CM) is played, a sharp peak appears in the spectrum. Accordingly, in the manner in which the peak rises up, which is calculated as a feature amount, when many sharp peaks are found to appear in the spectrum, it is determined that the input signal does not have a likelihood of a cheer scene.

The determination section 193 detects a cheer scene from the input signal by performing a linear identification or the like on the basis of the feature amounts supplied from the feature amount extraction section 192 and supplies a cheer detection signal indicating the detection result to the pseudo-cheer generation section 47.

Note that in the goal scene, a sharp peak caused by the narration appears in the spectrum, and in such a scene, depending on the manner in which the peak rises up, which is calculated as the feature amount, in other words, depending on the degree of the peak, the degree of likelihood of a cheer decreases disadvantageously.

Accordingly, the determination section 193 may perform a discrimination of the likelihood of the cheer scene by receiving the goal scene detection signal and by taking the detection result of the goal scene into account. In such a case, for example, when the likelihood of a cheer scene is decreasing with time and when it is determined that it is a goal scene, the likelihood of a cheer scene is prevented from decreasing.

Furthermore, while the cheer detection signal may be a signal that indicates whether there is a likelihood of a cheer scene, the cheer detection signal may be a multivalue signal indicating the degree of likelihood of a cheer scene.

In step S16, the pseudo-cheer generation section 47 detects the level of the input signals.

Specifically, the adding section 221 adds the supplied L-channel input signal and the supplied R-channel input signal together and supplies the resultant signal to the filter processing section 222 and the LPF 224.

The filter processing section 222 performs filter processing on the input signal supplied from the adding section 221 and supplies the input signal, in which the narration has been removed, to the level detection section 223. From an envelope of the absolute value of the signal supplied from the filter processing section 222, the level detection section 223 calculates the detection level A1 and supplies the detection level A1 to the tone controller 229 and the pseudo-cheer level controller 230.

Furthermore, the LPF 224 performs filter processing using the LPF on the input signal supplied from the adding section 221 and supplies the resultant signal to the level detection section 225. From an envelope of the absolute value of the signal supplied from the LPF 224, the level detection section 225 calculates the detection level A2 and supplies the detection level A2 to the pseudo-cheer level controller 230.

In step S17, the pseudo-cheer generation section 47 detects the level of the center orientation removal signal.

In other words, from an envelope of the absolute value of the center orientation removal signal supplied from the subtracting section 101, the level detection section 226 calculates the detection level B1 and supplies the detection level B1 to the pseudo-cheer level controller 230.

Furthermore, the LPF 227 performs filter processing using the LPF on the center orientation removed signal supplied from the subtracting section 101 and supplies the resultant signal to the level detection section 228. From an envelope of the absolute value of the signal supplied from the LPF 227, the level detection section 228 calculates the detection level B2 and supplies the detection level B2 to the pseudo-cheer level controller 230. In step S18, the tone controller 229 performs tone control of the pseudo-cheer signal on the basis of the detection level A1 from the level detection section 223 and the goal scene detection signal from the determination section 164.

For example, when the detection level A1 is gradually increasing, the tone controller 229 determining that excitement is increasing in the match venue lifts up the tone and, conversely, when the detection level A1 is gradually decreasing, drops the tone. Furthermore, when it is indicated that it is a goal scene by the goal scene detection signal, the tone controller 229 lifts up the tone even further.

Specifically, the above control of the tone of the pseudo-cheer signal is achieved by the tone controller 229 controlling the filter processing section 234 so as to change the characteristics of the filter used in the filter processing performed by the filter processing section 234.

Figure 12:
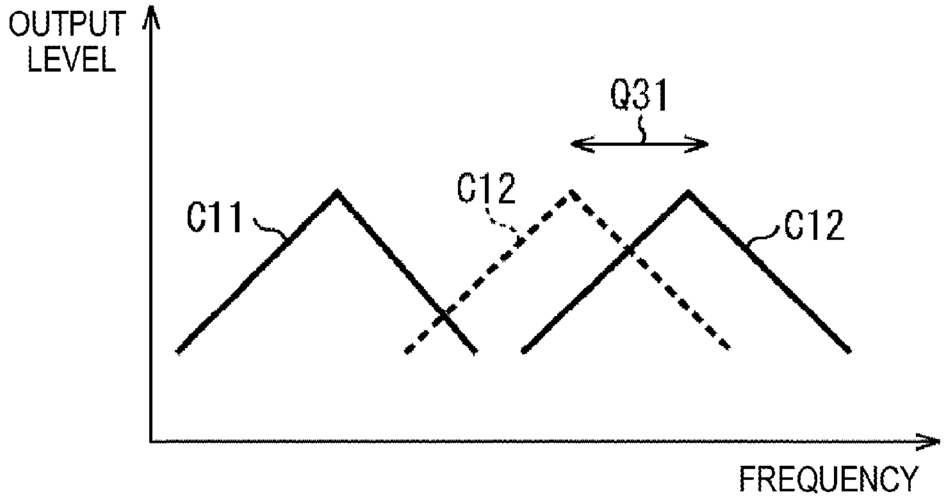
FIG. 12 is a diagram for describing filter characteristics and tone control.

For example, in the filter processing section 232 that generates a pseudo-cheer signal that is formed only of a low range component, a filter with a characteristic illustrated by a bent line C11 in FIG. 12 is used. Conversely, in the filter processing section 234 that generates a pseudo-cheer signal that is formed only of a middle to high range component, as illustrated by arrow Q31, the characteristic of the filter illustrated by a bent line C12 is changed in accordance with the control of the tone controller 229.

Note that in FIG. 12, the axis of abscissas indicates frequency and the axis of ordinates indicates an output level of the filter at each frequency.

In the above example, the waveform of the filter characteristic indicated by the bent line C12 is shifted in the frequency direction and in accordance with the shift, the tone of the pseudo-cheer signal is changed. The filter having the characteristic indicated by the bent line C12 has a characteristic of passing a component with a higher frequency band compared with the filter having the characteristic indicated by the bent line C11.

The filter processing section 234 determines the characteristics of the filter used in the filter processing in accordance with the control of the tone controller 229.

Note that the tone control of the pseudo-cheer signal performed by the tone controller 229 is not limited to the example described above and may be any kind of control.

In step S19, the pseudo-cheer level controller 230 detects the pseudo-cheer amount on the basis of the detection level A1 from the level detection section 223, the detection level A2 from the level detection section 225, the detection level B1 from the level detection section 226, the detection level B2 from the level detection section 228, the goal scene detection signal from the determination section 164, and the cheer detection signal from the determination section 193.

Specifically, the goal scene detection segment controller 261 performs level adjustment of the detection level A1 so that the level of the detection level A1 becomes higher by a fixed value in the goal scene indicated by the goal scene detection signal and supplies the resultant detection level A1 to the non-cheer detection segment controller 263.

Figure 13:
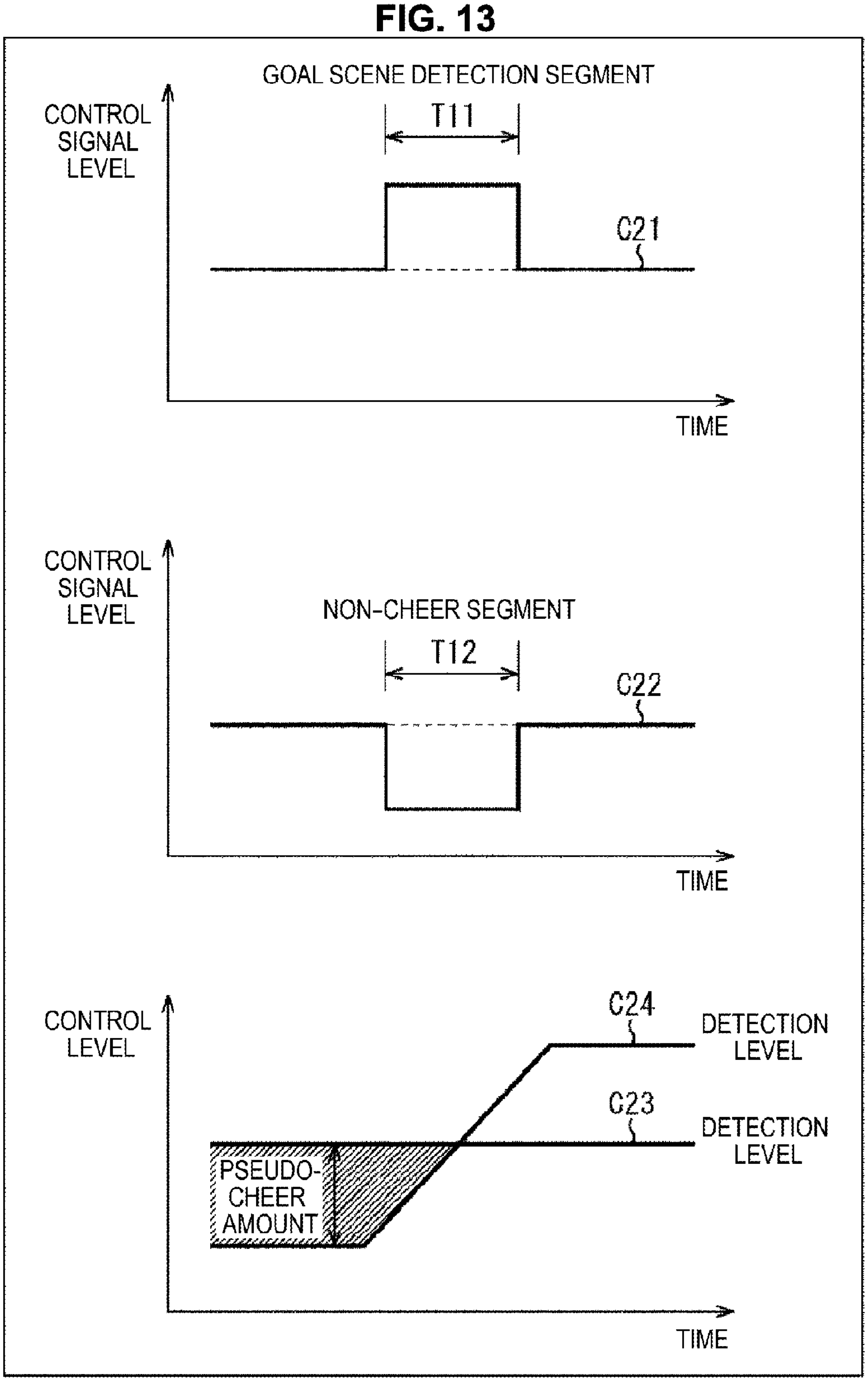
FIG. 13 is a diagram for describing a determination of a pseudo-cheer amount.

For example, as illustrated on the upper side of FIG. 13, the goal scene detection segment controller 261 adds a control signal level indicated by a bent line C21 to the detection level A1. Note that on the upper side of FIG. 13, the axis of ordinates indicates a control signal level and the axis of abscissas indicates time.

In the above example, in a segment T11 of the goal scene, the value of the control signal level indicated by the bent line C21 is higher than the values of the control signal levels of the other segments by a fixed value. Accordingly, level adjustment of the detection level A1 is performed on the goal scene so that the level of the detection level A1 becomes higher by a fixed value.

Furthermore, herein, a description of an example in which the level of the detection level A1 is set higher by a fixed value is given; however, when the goal scene detection signal indicates a value indicating the likelihood of a goal scene, the value of the detection level A1 may be increased continuously in accordance with the value indicating the likelihood of a goal scene. In other words, depending on the value indicating the likelihood of a goal scene, the increased value of the detection level A1 may differ.

Furthermore, the non-cheer detection section 262 generates a non-cheer detection signal by inverting the cheer detection signal and supplies the resultant signal to the non-cheer detection segment controller 263 and the non-cheer detection segment controller 266.

The non-cheer detection segment controller 263 performs level adjustment of the detection level A1 of the non-cheer scene indicated by the non-cheer detection signal such that the level of the detection level A1 from the goal scene detection segment controller 261 becomes low by a fixed value and supplies the resultant detection level A1 to the pseudo-cheer amount detection section 264.

For example as illustrated in the middle of FIG. 13, the non-cheer detection segment controller 263 adds a control signal level indicated by a bent line C22 to the detection level A1. Note that in the middle of FIG. 13, the axis of ordinates indicates a control signal level and the axis of abscissas indicates time.

In the above example, in a segment T12 of the non-cheer scene, the value of the control signal level indicated by the bent line C22 is lower than the values of the control signal levels of the other segments by a fixed value. Accordingly, level adjustment of the detection level A1 is performed on the non-cheer scene so that the level of the detection level A1 becomes lower by a fixed value. Note that in the non-cheer scene, the pseudo-cheer component may not be included in the narration canceling signal. Furthermore, herein, a description of an example in which the level of the detection level A1 is set lower by a fixed value is given; however, when the non-cheer detection signal indicates a value indicating the likelihood of a non-cheer scene, the value of the detection level A1 may be decreased continuously in accordance with the value indicating the likelihood of a non-cheer scene.

Furthermore, on the basis of the difference between the detection level A1 from the non-cheer detection segment controller 263 and the detection level B1 from the level detection section 226, the pseudo-cheer amount detection section 264 determines the pseudo-cheer amount and, on the basis of the pseudo-cheer amount, controls the amplification section 235.

For example, as illustrated by the slant lines on the lower side of FIG. 13, when the detection level B1 indicated by a bent line C24 is lower than the detection level A1 indicated by a straight line C23, the pseudo-cheer amount is set larger by the difference between the detection level A1 and the detection level B1. Note that on the lower side of FIG. 13, the axis of abscissas indicates time and the axis of ordinates indicates a detection level.

Generally, when the voices of the narration of an announcer and the like become large at a goal scene, the volume of the cheer becomes relatively small. In such a case, when the narration component is removed from the audio signal, there are cases in which the goal scene lacks excitement.

Accordingly, when the detection level B1 of the center orientation removal signal is lower than the detection level A1 of the original input signal, the pseudo-cheer amount detection section 264 increases the level of the pseudo-cheer signal by increasing the pseudo-cheer amount by the difference between the detection level B1 and the detection level A1. With the above, for example, the level of the narration canceling signal becomes high up to about the level of the original input signal such that, in an exciting scene such as a goal scene, a sense of presence and exhilaration can be achieved by a sufficient cheer volume.

In particular, in the pseudo-cheer level controller 230, the detection level A1 is adjusted so as to be even more higher in a goal scene and the difference between the detection level A1 and the detection level B1 becomes accordingly larger, and, as a result, the pseudo-cheer amount becomes large as well. With the above, audio in a goal scene being reproduced with a larger cheer and having a greater sense of presence can be obtained.

Conversely, in a non-cheer scene with no cheer such as a CM, since the detection level A1 is adjusted so as to be even more lower, unnecessary addition of the pseudo-cheer component to the narration canceling signal can be prevented. With the above, audio having further naturalness can be obtained.

Furthermore, the goal scene detection segment controller 265, the non-cheer detection segment controller 266, and the pseudo-cheer amount detection section 267 perform processes that are similar to those of the goal scene detection segment controller 261, the non-cheer detection segment controller 263, and the pseudo-cheer amount detection section 264 and determine the pseudo-cheer amount. Then, on the basis of the determined pseudo-cheer amount, the pseudo-cheer amount detection section 267 controls the amplification section 233.

In step S20, the pseudo-cheer generation section 47 generates a pseudo-cheer signal.

In other words, the random noise generation section 231 generates a random noise signal and supplies the random noise signal to the filter processing section 232 and the filter processing section 234.

The filter processing section 232 generates a pseudo-cheer signal by performing filter processing on the random noise signal from the random noise generation section 231 and supplies the pseudo-cheer signal to the amplification section 233. In accordance with the control of the pseudo-cheer amount detection section 267, the amplification section 233 amplifies the pseudo-cheer signal from the filter processing section 232 and supplies the resultant signal to the adding section 236.

Furthermore, the filter processing section 234 uses a filter that is determined by the control of the tone controller 229 and performs filter processing on the random noise signal from the random noise generation section 231 to generate a pseudo-cheer signal, and supplies the pseudo-cheer signal to the amplification section 235.

In accordance with the control of the pseudo-cheer amount detection section 264, the amplification section 235 amplifies the pseudo-cheer signal supplied from the filter processing section 234 and supplies the resultant signal to the adding section 236.

The adding section 236 adds the pseudo-cheer signal supplied from the amplification section 233 with the pseudo-cheer signal supplied from the amplification section 235 together to generate a final pseudo-cheer signal and supplies the final pseudo-cheer signal to the adding section 48 of the narration cancelling section 21.

In step S21, the adding section 48 adds the signal supplied from the adding section 44 and the pseudo-cheer signal supplied from the adding section 236 together to generate a narration canceling signal and supplies the narration canceling signal to the selector 23 and the stadium reverberation adding section 24. For example, the pseudo-cheer signal is added to the signal of each channel output from the adding section 44 and a stereo narration canceling signal configured of an L-channel and an R-channel is formed.

Furthermore, in accordance with the control of the controller 22, the selector 23 supplies, to the adding section 25, either one of the supplied input signal and the narration canceling signal supplied from the adding section 48 of the narration cancelling section 21.

In step S22, the stadium reverberation adding section 24 adds a reverberation effect to the narration canceling signal by performing acoustic processing on the narration canceling signal provided from the narration cancelling section 21.

The stadium reverberation adding section 24 outputs a rear signal configured of an L-channel and an R-channel that is acquired by addition of the reverberation effect to the subsequent stage and supplies a front signal configured of an L-channel and an R-channel that is acquired by addition of the reverberation effect.

In step S23, the adding section 25 adds, in each of the channels, the signal, that is, the input signal or the narration canceling signal, that has been supplied from the selector 23 and the front signal that has been supplied from the stadium reverberation adding section 24 together to form a final front signal.

The stadium effect generating processing is ended when the adding section 25 outputs the generated front signal configured of the L-channel and the R-channel.

In the above manner, the stadium effect generating device 11 adds the reverberation of the stadium to the narration canceling signal that has been acquired by removing narration from the input signal and by adding the pseudo-cheer signal to the resultant input signal.

As described above, by removing the narration from the input signal and adding the reverberation of the stadium to the resultant input signal, audio that has a greater sense of presence can be obtained.

For example, in the audio of the input signal, when the voice of the narration is too large, the voice becomes harsh on the ears the more and a sense of presence is not capable of being obtained in a sufficient manner. Furthermore, if the sound effect is added to an input signal in which the narration component is large, a broadening sensation is added to the narration and the sense of presence is reduced the more.

Conversely, in the stadium effect generating device 11, since the narration is removed from the input signal and the reverberation of the stadium is added to the resultant input signal, audio that is more natural and that has a sense of presence can be obtained. Particularly, by generating the narration canceling signal by adding the stereo center suppression signal that has a sense of presence and the monaural center orientation removal signal acquired by removing the center orientation component together, a signal that has a sense of presence and in which narration has been sufficiently removed can be acquired.

Moreover, in the stadium effect generating device 11, a pseudo-cheer component at an appropriate level is added to the narration canceling signal in accordance with the comparison result between the level of the input signal and the level of the center orientation removal signal, the detection result of the goal scene, and the detection result of the non-cheer scene. With the above, the sense of presence can be improved even further.

MODIFICATION 1

<Exemplary Configuration of Pseudo-Cheer Level Controller>

In the above, note that a case in which the pseudo-the amount is determined while taking the detection result of the goal scene and the detection result of the non-cheer scene into account has been described; however, the detection result of the goal scene and the detection result of the non-cheer scene may not be used to determine the pseudo-cheer amount.

Figure 14:
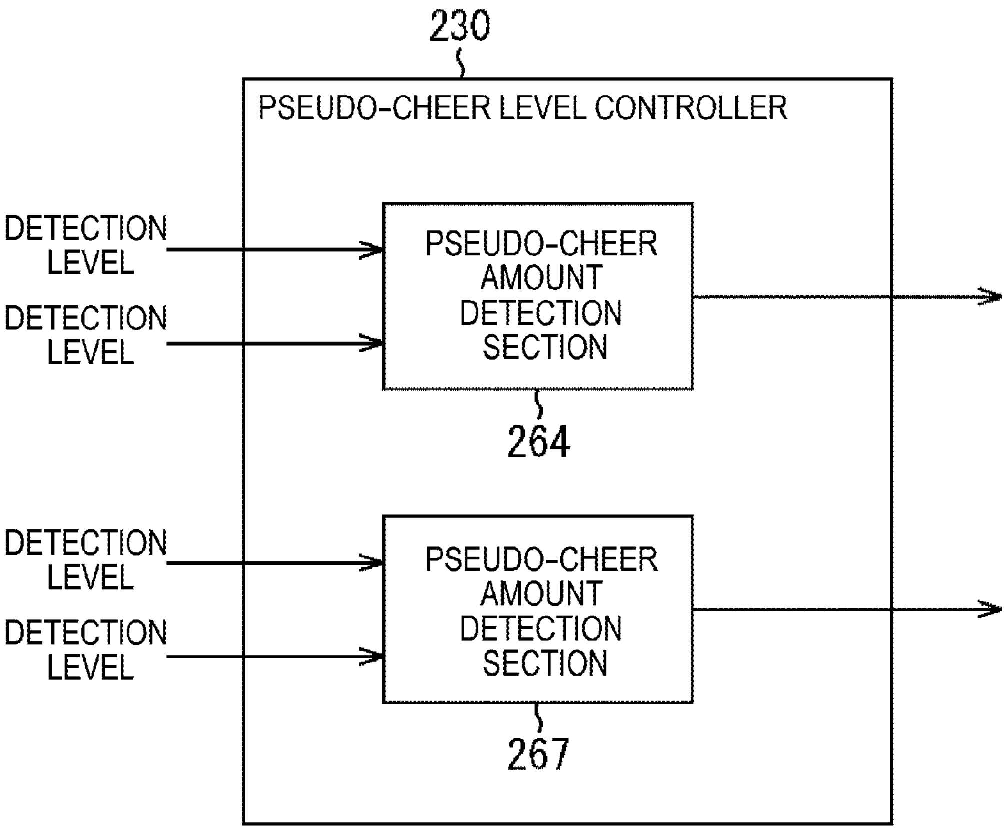
FIG. 14 is a diagram illustrating another exemplary configuration of the pseudo-cheer level controller.

In such a case, the pseudo-cheer level controller 230 is configured in a manner illustrated in FIG. 14, for example. Note that in FIG. 14, portions that correspond to the case of FIG. 9 are attached with the same reference numerals and descriptions thereof are omitted as appropriate.

The pseudo-cheer level controller 230 illustrated in FIG. 14 includes the pseudo-cheer level controller 230 and the pseudo-cheer amount detection section 267.

The pseudo-cheer amount detection section 264 determines the pseudo-cheer amount by comparing the detection level A1 from the level detection section 223 with the detection level B1 supplied from the level detection section 226 and, on the basis of the pseudo-cheer amount, controls the amplification section 235.

Furthermore, the pseudo-cheer amount detection section 267 determines the pseudo-cheer amount by comparing the detection level A2 supplied from the level detection section 225 with the detection level B2 supplied from the level detection section 228 and, on the basis of the pseudo-cheer amount, controls the amplification section 233.

Furthermore, in the pseudo-cheer level controller 230 illustrated in FIG. 9, the goal scene detection segment controller 261 and the non-cheer detection segment controller 263 may not be provided or the goal scene detection segment controller 265 and the non-cheer detection segment controller 266 may not be provided. Furthermore, either one of the goal scene detection segment controller 261 or the non-cheer detection segment controller 263 may not be provided or either one of the goal scene detection segment controller 265 or the non-cheer detection segment controller 266 may not be provided.

MODIFICATION 2

<Exemplary Configuration of Stadium Effect Generating Device>

Furthermore, in the above, an example in which a front signal with two channels and a signal with two channels are output from the stadium effect generating device 11 has been described; however, stereo signals configured of an L-channel and an R-channel may be output.

Figure 15:
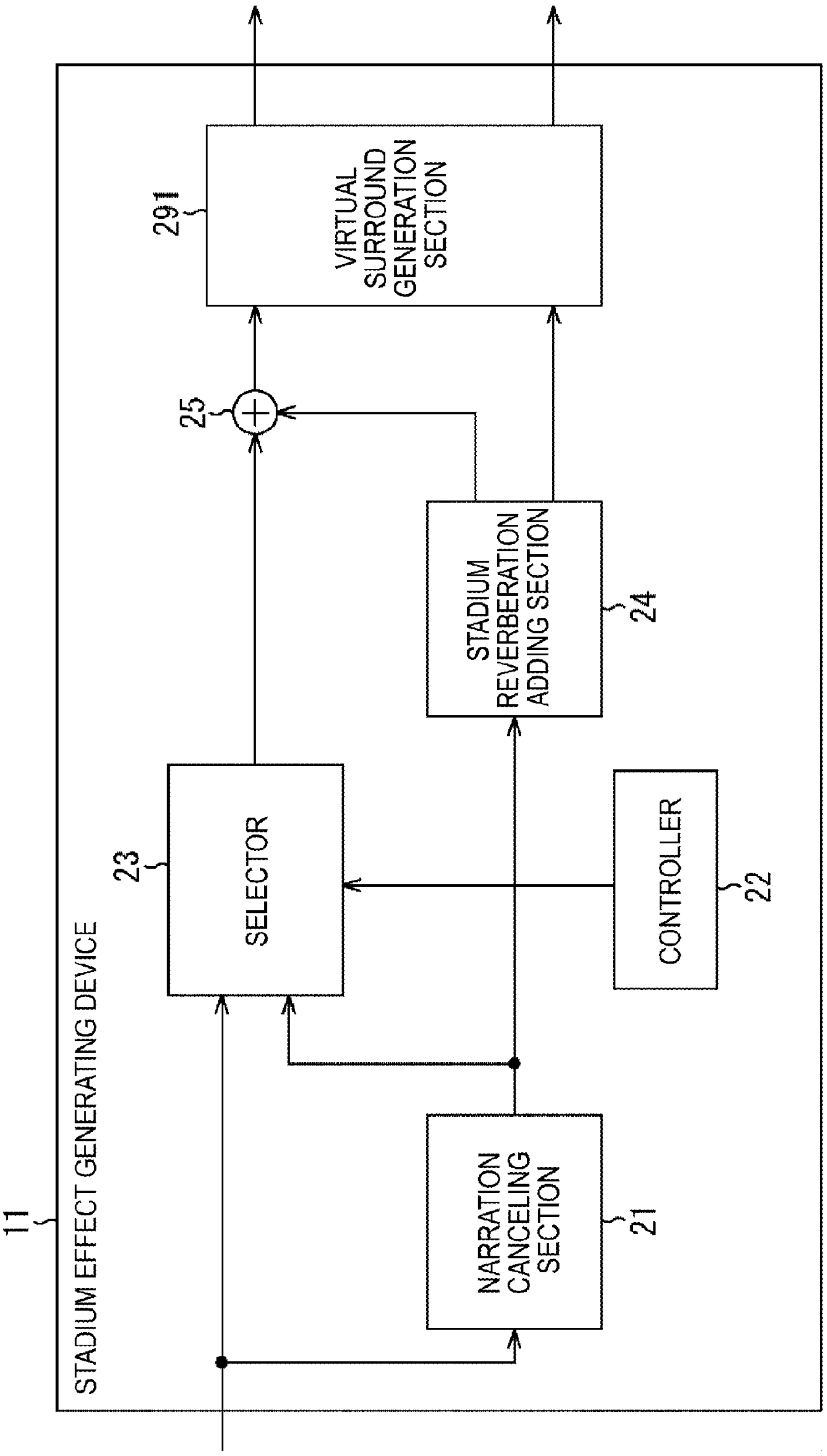
FIG. 15 is a diagram for illustrating another exemplary configuration of the stadium effect generating device.

In such a case, the stadium effect generating device 11 is configured in a manner illustrated in FIG. 15, for example. Note that in FIG. 15, portions that correspond to the case of FIG. 1 are attached with the same reference numerals and descriptions thereof are omitted as appropriate.

In the stadium effect generating device 11 illustrated in FIG. 15, a virtual surround generation section 291 is further provided in the stadium effect generating device 11 illustrated in FIG. 1 and, except for the above, the stadium effect generating device 11 illustrated in FIG. 15 is configured in the same manner as that of the stadium effect generating device 11 in FIG. 1.

The virtual surround generation section 291 generates stereo signals configured of an L-channel and an R-channel on the basis of the rear signal configured of an L-channel and an R-channel that has been supplied from the stadium reverberation adding section 24 in the front signal configured of an L-channel and an R-channel that has been supplied from the adding section 25 and outputs the stereo signals. For example, the generation of the stereo signal is performed by convolution of the rear signal and the front signal using a head-related transfer function (HRTF).

The series of processes described above can be executed by hardware but can also be executed by software. When the series of processes is executed by software, a program that constructs such software is installed into a computer. Here, the expression "computer" includes a computer in which dedicated hardware is incorporated and a general-purpose personal computer or the like that is capable of executing various functions when various programs are installed.

Figure 16:
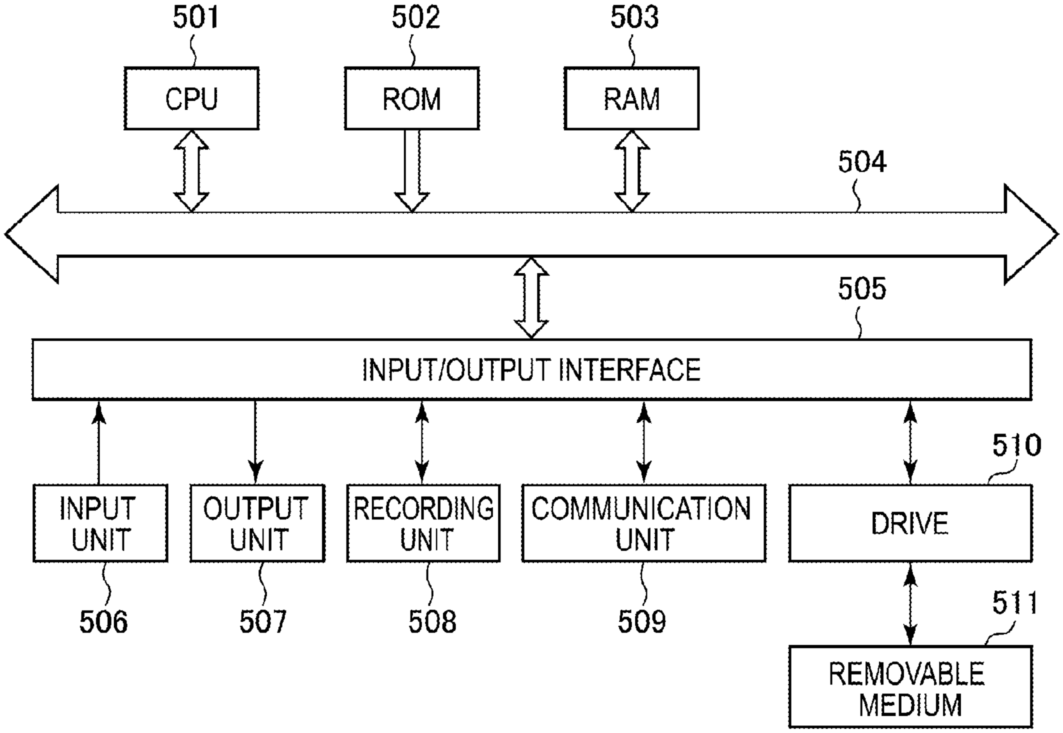
FIG. 16 is a diagram illustrating an exemplary configuration of a computer.

FIG. 16 is a block diagram showing a hardware configuration example of a computer that performs the above-described series of processing using a program.

In the computer, a central processing unit (CPU) 501, a read only memory (ROM) 502 and a random access memory (RAM) 503 are mutually connected by a bus 504.

An input/output interface 505 is also connected to the bus 504. An input unit 506, an output unit 507, a recording unit 508, a communication unit 509, and a drive 510 are connected to the input/output interface 505.

The input unit 506 is configured from a keyboard, a mouse, a microphone, an imaging element or the like. The output unit 507 is configured from a display, a speaker or the like. The recording unit 508 is configured from a hard disk, a non-volatile memory or the like. The communication unit 509 is configured from a network interface or the like. The drive 510 drives a removable medium 511 such as a magnetic disk, an optical disk, a magneto-optical disk, a semiconductor memory or the like.

In the computer configured as described above, the CPU 501 loads a program that is stored, for example, in the recording unit 508 onto the RAM 503 via the input/output interface 505 and the bus 504, and executes the program. Thus, the above-described series of processing is performed.

Programs to be executed by the computer (the CPU 501) are provided being recorded in the removable medium 511 which is a packaged medium or the like. Also, programs may be provided via a wired or wireless transmission medium, such as a local area network, the Internet or digital satellite broadcasting.

In the computer, by loading the removable medium 511 into the drive 510, the program can be installed into the recording unit 508 via the input/output interface 505. It is also possible to receive the program from a wired or wireless transfer medium using the communication unit 509 and install the program into the recording unit 508. As another alternative, the program can be installed in advance into the ROM 502 or the recording unit 508.

It should be noted that the program executed by a computer may be a program that is processed in time series according to the sequence described in this specification or a program that is processed in parallel or at necessary timing such as upon calling.

An embodiment of the disclosure is not limited to the embodiments described above, and various changes and modifications may be made without departing from the scope of the disclosure.

For example, the present disclosure can adopt a configuration of cloud computing which processes by allocating and connecting one function by a plurality of apparatuses through a network.

Further, each step described by the above mentioned flow charts can be executed by one apparatus or by allocating a plurality of apparatuses.

In addition, in the case where a plurality of processes is included in one step, the plurality of processes included in this one step can be executed by one apparatus or by allocating a plurality of apparatuses.

Additionally, the present technology may also be configured as below.

(1)

An audio processing device including: a narration canceling section configured to generate a narration canceling signal by removing a narration component from an input signal; and a reverberation adding section configured to add a reverberation effect to the narration canceling signal.

(2)

The audio processing device according to (1), wherein the narration canceling section generates the narration canceling signal that includes a pseudo-cheer component.

(3)

The audio processing device according to (1), wherein the narration canceling section generates a center suppression signal having a plurality of channels by suppressing a center orientation component included in the input signal having a plurality of channels, generates, on a basis of the input signal having a plurality of channels, a monaural center orientation removal signal in which the center orientation component has been removed, and configures the narration canceling signal by adding the center suppression signal and the center orientation removal signal together.

(4)

The audio processing device according to (3), wherein the narration canceling section further generates a pseudo-cheer signal that is a pseudo-cheer component and configures the narration canceling signal by adding the center suppression signal, the center orientation removal signal, and the pseudo-cheer signal together.

(5)

The audio processing device according to (4), wherein the narration canceling section performs level adjustment of the pseudo-cheer signal on a basis of a comparison result between a level of the input signal and a level of the center orientation removal signal.

(6)

The audio processing device according to (4) or (5), wherein the input signal is an audio signal of a sports related content.

(7)

The audio processing device according to (6), wherein the narration canceling section detects a score scene on a basis of the input signal and performs level adjustment of the pseudo-cheer signal on a basis of a detection result of the score scene.

(8)

The audio processing device according to (6) or (7), wherein the narration canceling section detects a non-cheer scene on a basis of the input signal and performs level adjustment of the pseudo-cheer signal on a basis of a detection result of the non-cheer scene.

(9)

An audio processing method including the steps of:

generating a narration canceling signal by removing a narration component from an input signal; and adding a reverberation effect to the narration canceling signal.

(10)

A program for causing a computer to execute the processing of:

generating a narration canceling signal by removing a narration component from an input signal; and adding a reverberation effect to the narration canceling signal.

REFERENCE SIGNS LIST

11 stadium effect generating device
21 narration cancelling section
24 stadium reverberation adding section
25 adding section
41 stereo center suppression section
42 center orientation signal removal section
44 adding section
45 goal scene detection section
46 cheer detection section
47 pseudo-cheer generation section

The invention claimed is:

1. An audio processing device comprising:
a narration canceling section that generates a narration canceling signal by removing a narration component from an input signal; and
a reverberation adding section that adds a reverberation effect to the narration canceling signal;
wherein the narration canceling section generates a center suppression signal having a plurality of channels by suppressing a center orientation component included in the input signal having a plurality of channels, generates, on a basis of the input signal having a plurality of channels, a monaural center orientation removal signal in which the center orientation component has been removed, and configures the narration canceling signal by adding the center suppression signal and the center orientation removal signal together.

2. The audio processing device according to claim 1, wherein the narration canceling section generates the narration canceling signal that includes a pseudo-cheer component.

3. The audio processing device according to claim 1, wherein the narration canceling section further generates a pseudo-cheer signal that is a pseudo-cheer component and configures the narration canceling signal by adding the center suppression signal, the center orientation removal signal, and the pseudo-cheer signal together.

4. The audio processing device according to claim 3, wherein the narration canceling section performs level adjustment of the pseudo-cheer signal on a basis of a comparison result between a level of the input signal and a level of the center orientation removal signal.

5. The audio processing device according to claim 4, wherein the input signal is an audio signal of a sports related content.

6. The audio processing device according to claim 5, wherein the narration canceling section detects a score scene on a basis of the input signal and performs level adjustment of the pseudo-cheer signal on a basis of a detection result of the score scene.

7. The audio processing device according to claim 6, wherein the narration canceling section detects a non-cheer scene on a basis of the input signal and performs level adjustment of the pseudo-cheer signal on a basis of a detection result of the non-cheer scene.

* * * * *